United States Patent [19]
Miyatake et al.

[11] Patent Number: 5,970,003
[45] Date of Patent: Oct. 19, 1999

[54] SEMICONDUCTOR MEMORY DEVICE

[75] Inventors: Shinichi Miyatake, Ome; Shuuichi Kubouchi, Fussa, both of Japan

[73] Assignees: Hitachi, Ltd.; Hitachi ULSI Systems Co., Ltd., both of Tokyo, Japan

[21] Appl. No.: 09/084,251

[22] Filed: May 26, 1998

[30] Foreign Application Priority Data

May 26, 1997 [JP] Japan .................................. 9-151548

[51] Int. Cl.[6] ...................................................... G11C 7/00
[52] U.S. Cl. ................... 365/200; 365/230.03; 365/225.7
[58] Field of Search .............................. 365/200, 230.03, 365/225.7

[56] References Cited

U.S. PATENT DOCUMENTS

| | | | |
|---|---|---|---|
| 5,532,966 | 7/1996 | Poteet et al. | 365/200 |
| 5,652,725 | 7/1997 | Suma et al. | 365/200 |
| 5,691,952 | 11/1997 | Sasaki et al. | 365/200 |

FOREIGN PATENT DOCUMENTS

| | | |
|---|---|---|
| 6-295592 | 10/1994 | Japan . |
| 8-77791 | 3/1996 | Japan . |
| 9-7389 | 1/1997 | Japan . |

*Primary Examiner*—Vu A. Le
*Attorney, Agent, or Firm*—Antonelli, Terry, Stout & Kraus, LLP

[57] ABSTRACT

A semiconductor memory device comprising at least one memory mat comprised of a plurality of memory cells respectively provided at points where a plurality of word lines and spare word lines respectively intersect a plurality of bit lines and spare bit lines placed so as to intersect the word lines and spare word lines. In the semiconductor memory device, a plurality of fuse means allowed to open or remain unopen in accordance with stored information encoded with respect to addresses for specifying defective word lines or defective bit lines are used to control gate means based on their corresponding complementary signals. Thus, the gate means transmit signals for selecting their corresponding word lines or bit lines to thereby produce coincidence/non-coincidence signals.

18 Claims, 16 Drawing Sheets

SEMICONDUCTOR MEMORY DEVICE

BACKGROUND OF THE INVENTION

This invention relates to a semiconductor memory device, and principally to a technique which is effective for use in effecting defect relief in a dynamic RAM (Random Access Memory).

A defective bit-free chip cannot be formed any more in a semiconductor memory device in which attempts have been made to achieve mass storage capacities such as 64 Mbits, 256 Mbits, etc. It is essential for redundant circuits for switching faulty or defective word lines or bit lines to spare word lines or bit lines, respectively, to be provided for such a semiconductor memory device. In this case, fuses have been used to store faulty or defective addresses. However, in a configuration wherein fuses are provided in one-to-one-correspondence with complementary address signals comprised of "true (True)" and "bar (Bar)" signals and one of them is rendered open to store defective addresses, a vast number of fuses are needed, thus resulting in an undesirable increase in the chip size. If the number of the fuses is restricted to avoid an undue increase in the chip size, then a problem arises in that the efficiency of relief is sacrificed.

Various redundant circuits using fuses have been described in Japanese Patent Application Laid-Open Nos. 6295592, 9-7389 and 8-77791.

SUMMARY OF THE INVENTION

With the foregoing in mind, it is an object of the present invention to provide a semiconductor memory device comprising defect relief circuits which are capable of storing and comparing defective addresses with satisfactory efficiency using a smaller number of fuses.

It is another object of the present invention to provide a semiconductor memory device comprising defect relief circuits each capable of storing and comparing defective addresses with satisfactory efficiency using a smaller number of fuses without sacrificing operating speed.

The above and other objects of the present invention and novel features thereof will become more apparent from the description in the present specification and from the accompanying drawings.

In order to achieve the above objects, a summary of a typical one of the features disclosed in the present application will be briefly described as follows: In a semiconductor memory device having at least one memory mat comprising a plurality of memory cells respectively provided at points where a plurality of word lines and spare word lines intersect a plurality of bit lines and spare bit lines, which are placed so as to intersect the plurality of word lines and spare word lines, respectively, a plurality of fuse means opened in accordance with stored information encoded with respect to addresses for specifying defective memory mats are used to control gate means in accordance with their corresponding complementary signals, whereby signals for selecting a corresponding memory mat are transmitted from the gate means to produce coincidence and/or non-coincidence signals.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
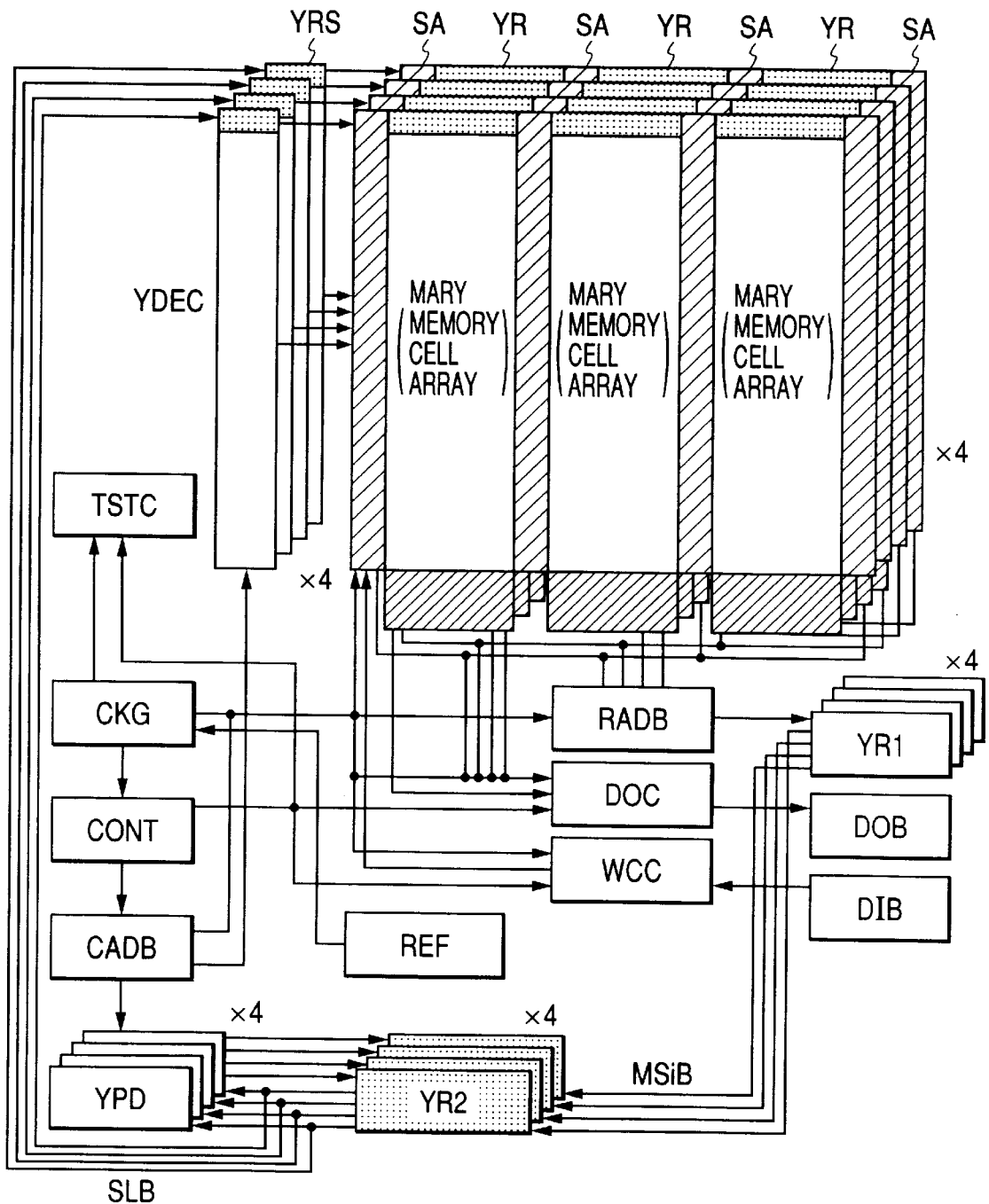
FIG. 1 is a schematic block diagram showing one embodiment of a semiconductor memory device according to the present invention.

FIG. 1 is a schematic block diagram showing one embodiment of a semiconductor memory device according to the present invention. The semiconductor memory device according to the present embodiment is intended for use as an SDRAM (Synchronous DRAM) and is formed on a single semiconductor substrate, such as monocrystalline silicon, by a known semiconductor integrated circuit manufacturing technique.

The SDRAM according to the present embodiment comprises memory cell arrays MARYs in four sets (x 4), each of which constitutes a memory bank (Bank) 0 through a memory bank 3. Each individual memory cell array MARY is provided with dynamic memory cells disposed in a matrix form. According to the drawing, selection terminals of the memory cells which extend in the longitudinal direction are electrically connected to corresponding word lines (not shown) in every column. Further, data input/output terminals of the memory cells disposed in the same rows extending in the transverse direction are electrically connected to corresponding complementary bit lines in every row.

As a result of decoding of an X address signal using an X decoder XD, one of the unillustrated word lines of each memory array MARY is substantially driven to a selection level by a word driver WD in accordance with an unillustrated row-system timing signal. Unillustrated complementary bit lines of the memory cell array MARY are electrically connected to a corresponding sense amplifier SA. The sense amplifier SA is provided with a column selection circuit as will be described later. The sense amplifier SA detects and amplifies a small potential difference developed between the respective complementary bit lines by the reading of data from each memory cell according to the selection of a corresponding word line. Each individual column switch circuit thereof individually selects complementary bit lines and allows continuity between the selected complementary bit lines and a complementary common input/output line. A column switch circuit is selectively activated in accordance with the result of decoding of a column address signal by a corresponding Y decoder YDEC. The four pairs of memory cell arrays MARYs are respectively provided with the X decoders XDs and word drivers WDs and the Y decoders YDEC described above.

The device common input/output line is electrically connected to an input of a data output control circuit DOC and an output terminal of a write control circuit WCC. A signal outputted from the data output control circuit DOC is supplied to an unillustrated external terminal through a data output buffer DOB. A write signal inputted from an unillustrated external terminal is supplied to an input terminal of a data input buffer DIB. A signal outputted from the data input buffer DIB is supplied to an input terminal of the write control circuit WCC. The external terminal for outputting the read signal and the external terminal for inputting the write signal are placed in common use. The read and write signals are inputted and outputted in units of a plurality of bits, such as 16 bits.

Address signals supplied from unillustrated address input terminals are stored into a row address buffer RADB and a column address buffer CADB in address multiplex form. The supplied address signals are held by their address buffers RADB and CADB. For example, the row address buffer RADB and the column address buffer CADB respectively hold the captured address signals over one memory cycle period.

The row address buffer RADB captures a refresh address signal outputted from a refresh control circuit RFC as a row address signal in a refresh operation mode. In the present embodiment, the row address buffer RADs takes in the refresh address signal as a row address signal through a clock generator CKG. The address signals received by the column address buffer CADB are supplied to a column address counter included in a control circuit CONT as preset data. Depending on an operation mode specified by a command or the like to be described later, the column address counter outputs column address signals used as pre-set data or values obtained by successively incrementing the column address signals to a Y decoder YDEC.

The control circuit CONT is supplied with external control signals, such as a clock signal CLK, a clock enable signal CKE, a chip select signal /CS, a column address strobe signal /CAS (where symbol / means that signals provided with / correspond to low enable signals), a row address strobe signal /RAS, a write enable signal /WE, a data input/output mask control signal DQM, etc., and address signals corresponding to memory banks. Further, the control circuit CONT forms or generates various control signals, such as an SDRAM operation mode, etc. and various timing signals corresponding to them, based on changes in the levels of the supplied signals and timings or the like and is provided with a control logic and a mode register used for their generation. The state in which the chip select signal /CS is high in level (chip non-selected state) and other inputs do not make sense. However, the state of selection of each memory bank and internal operations such as a burst operation, etc. to be described later are not affected by the change to the chip nonselected state. The respective signals /RAS, /CAS and /WE are different in function from corresponding signals employed in an ordinary DRAM and are regarded as significant signals when command cycles to be described later are defined.

The clock signal CLK is set as a master clock for the SDRAM and other external input signals are assumed as significant in synchronism with the leading edge of the corresponding internal clock signal. The chip select signal /CS provides instructions for the beginning or start of a command input cycle according to its low level. The clock generator CKG generates an internal clock signal synchronized with a clock signal supplied from an external terminal and comprises a PLL circuit, a DLL circuit, or a synchronizing circuit for providing synchronization of a clock signal supplied from an external terminal while being delayed by two cycles.

The clock enable signal CKE corresponds to a signal indicative of the effectiveness of the next clock signal. When the corresponding signal CKE is high in level, the leading edge of the next clock signal CLK is made effective. On the other hand, when the signal CKE is low in level, the next clock signal CLK is made ineffective. Further, the external control signal DQM for performing output enable control on the data output buffer Dos is also supplied to the control circuit CONT in a read mode. When the external control signal DQM is high in level, for example, the data output buffer DOB is brought into a high output impedance state. When a test mode is specified, a test circuit TSTC is activated to perform test operations, such as compare decisions at the time of batch writing and reading, etc.

The row address signal is defined according to the level of an address signal in a row address strobe/bank active command cycle to be described later, synchronized with the leading edge of the clock signal CLK (internal clock signal). The input of the two most significant bits is regarded as a bank selection signal in the row address strobe/bank active command cycle. Namely, one of the four memory banks 0 through 3 is selected according to the combination of the two bits. Control on the selection of the memory banks can be exercised various by processes, such as the activation of only row decoders on the selected memory bank side, the non-selection of all the column switch circuits on the non-selected memory bank side, connections to the data input buffer DIB and the data output buffer DOB only on the selected memory bank side, etc.

The input of a specific address signal in a precharge command cycle to be described later indicates the mode of a precharge operation with respect to the complementary bit lines or the like. A high level of the specific address signal indicates that the objects to be precharged are two memory banks. A low level thereof indicates that one memory bank specified by the address signal for designating each memory bank referred to above is an object to be precharged. Each column address signal referred to above is defined according to the level of the corresponding address signal in a read or write command (corresponding to a column address/read command or a column address/write command to be described later) cycle synchronized with the leading edge of the clock signal CLK (internal clock). The column address defined in this way is regarded as a start address for burst access.

Main operation modes of the SDRAM instructed by commands will next be described.

(1) Mode Register Set Command (Mo):

This is a command for setting a mode register. The corresponding command is specified by /CS, /RAS, /CAS and /WE=low level. Data (register set data) to be set is supplied through each address terminal. Although the invention is not restricted in particular, the register set data is defined as a burst length, a CAS latency, a write mode or the like. Although the invention is not restricted in particular, a settable burst length takes 1, 2, 4, 8 and a full page. A settable CAS latency assumes 1, 2 and 3. A settable write mode is defined as burst write and single write.

The CAS latency indicates what cycles of the internal clock signal are wasted from the falling edge of the /CAS to the output operation of the data output buffer DOB in the case of a read operation specified by a column address/read command to be described later. Since an internal operation time used for the reading of data is required until the read data is established or determined, the CAS latency is used to set the internal operation time according to the frequency of the internal clock signal. In other words, when an internal clock signal of a high frequency is used, the CAS latency is set to a relatively large value. On the other hand, when an internal clock signal of a low frequency is used, the CAS latency is set to a relatively small value. Although the invention is not restricted in particular, the CAS latency may be set to a large value if necessary to ensure the time required to select a word line in the case of an image processing operation to be described later.

(2) Row Address Strobe/Bank Active Command (Ac):

This is a command for providing instructions for a row address strobe and for making the selection of a memory bank effective. This command is specified according to /CS and /RAS=low level and /CAS and /WE=high level. At this time, addresses supplied to address terminals, excluding those for the two most significant bits, are captured as row address signals, and signals supplied to the address terminals for the two most significant bits are captured as signals for selecting memory banks. Their capture operations are executed in synchronism with the leading edge of the internal clock signal as described above. When the corresponding command is specified, for example, a word line in a memory bank specified by the command is selected. Thus, memory cells connected to the corresponding word line and their corresponding complementary bit lines are brought into conduction.

(3) Column Address/Read Command (Re):

This is a command required to start a burst read operation. Further, this command is also a command for providing instructions for a column address strobe. The present command is specified according to /CS and /CAS=low level and /RAS and /WE=high level. At this time, column addresses supplied as address signals inputted from predetermined address terminals, which are assigned to Y addresses, are captured as column address signals, respectively. Thus, the captured column address signals are supplied to a column address counter as burst start addresses. Before the burst read operation specified thereby, a memory bank and a word line lying therein are selected in the row address strobe/bank active command cycle. Upon the burst read operation in this state, memory cells connected to the selected word line are successively selected in accordance with an address signal outputted from the column address counter in synchronism with the internal clock signal, and items of data are sequentially read therefrom. The number of the sequentially-read data is set as a number specified by the above burst length. The data output buffer DOB starts reading data while waiting for the number of cycles in the internal clock signal defined by the CAS latency.

(4) Column Address/Write Command (Wr):

When a burst write command sets the mode register to a write operation mode, this command operates to start a corresponding burst write operation. When a single write command sets the mode register to a write operation mode, this command to start a corresponding single write operation. Further, the corresponding command provides instructions for column address strobes for the single write and the burst write operations. The command is specified according to /CS, /CAS and /WE=low level and /RAS=high level. At this time, the address signals assigned to the Y addresses are captured as column address signals. Thus, the captured column address signals are supplied to the column address counter as burst start addresses in the case of a burst write operation. The procedure of the burst write operation specified thereby is also performed in a manner similar to the burst read operation. However, no CAS latency is provided for the write operation and the capturing of the write data is started from the column address/write command cycle.

(5) Precharge Command (Pr):

This is defined as a command for starting a precharge operation on a memory bank selected by A10 and A11. This command is specified by /CS, /RAS and /WE=low level and /CAS=high level.

(6) Autorefresh Command:

This is a command required to start autorefresh and is specified by /CS, /RAS and /CAS=low level and /WE and /CKE=high level.

(7) Burst Stop/in/Full Page Command:

This is a command required to stop all the memory banks from participating in a burst operation for a full page. This command is ignored in burst operations other than for a full page. This command is specified by /CS and /WE=low level and /RAS and /CAS=high level.

(8) No-operation Command (Nop):

This is a command for indicating the non-execution of a substantial operation and is specified by /CS=low level and /RAS, /CAS and /WE=high level.

When another memory bank is specified in the course of a burst operation and the row address strobe/bank active command is supplied while the burst operation is performed in one memory bank in the SDRAM, no influence is imposed on the operation of one memory bank under the corresponding execution and the operation of a row address system in another memory bank is enabled.

Thus, while a non-processed command is being executed, the precharge command and the row address strobe/bank active command for a memory bank different from the memory banks to be processed by the command under execution are issued unless data collide with each other at a data input/output terminal to thereby make it possible to start an internal operation in advance.

Since the SDRAM is capable of inputting and outputting data, addresses and control signals in synchronism with the clock signal CLK (internal clock signal), a large-capacity memory similar to a DRAM can be activated at high speed equivalent to that for a SRAM. It can be understood that how many data should be accessed for the selected one word line is specified by the burst length, and thereby, a plurality of data can be read or written in this state while selected states in a column system are being successively switched by a built-in column address counter.

The present embodiment provides a typical column-system failure or defect relief circuit by way of illustrative example. Spare bit lines YR are provided for each memory cell array. Each Y decoder YDEC has a circuit YRS for selecting the corresponding spare bit lines YR. In order to store information about defective bit lines of each memory cell array corresponding to a normal circuit, there are provided a first column relief circuit YR1 for storing mat select signals included in each memory cell array MARY referred to above and for making a signal comparison between the corresponding memory mat and a selected memory mat, and a second column relief circuit YR2 for storing addresses for defective bits in one memory mat and for performing a comparison between signals obtained by pre-decoding the addresses and pre-decoded signals used for bit line selection, which are produced by the corresponding column pre-decoder YPD.

When the first and second column relief circuits YR1 and YR2 determine that a corresponding access is a memory access to defective bit lines, a signal SLB for selecting spare bit lines is generated to control the selection circuit YRS so as to select the spare bit lines. At this time, the output of the Y decoder YDEC is made ineffective by the signal SLB. In other words, all the Y select lines are brought to a non-selected state and are controlled so that defective bit lines are not selected.

Figure 2:
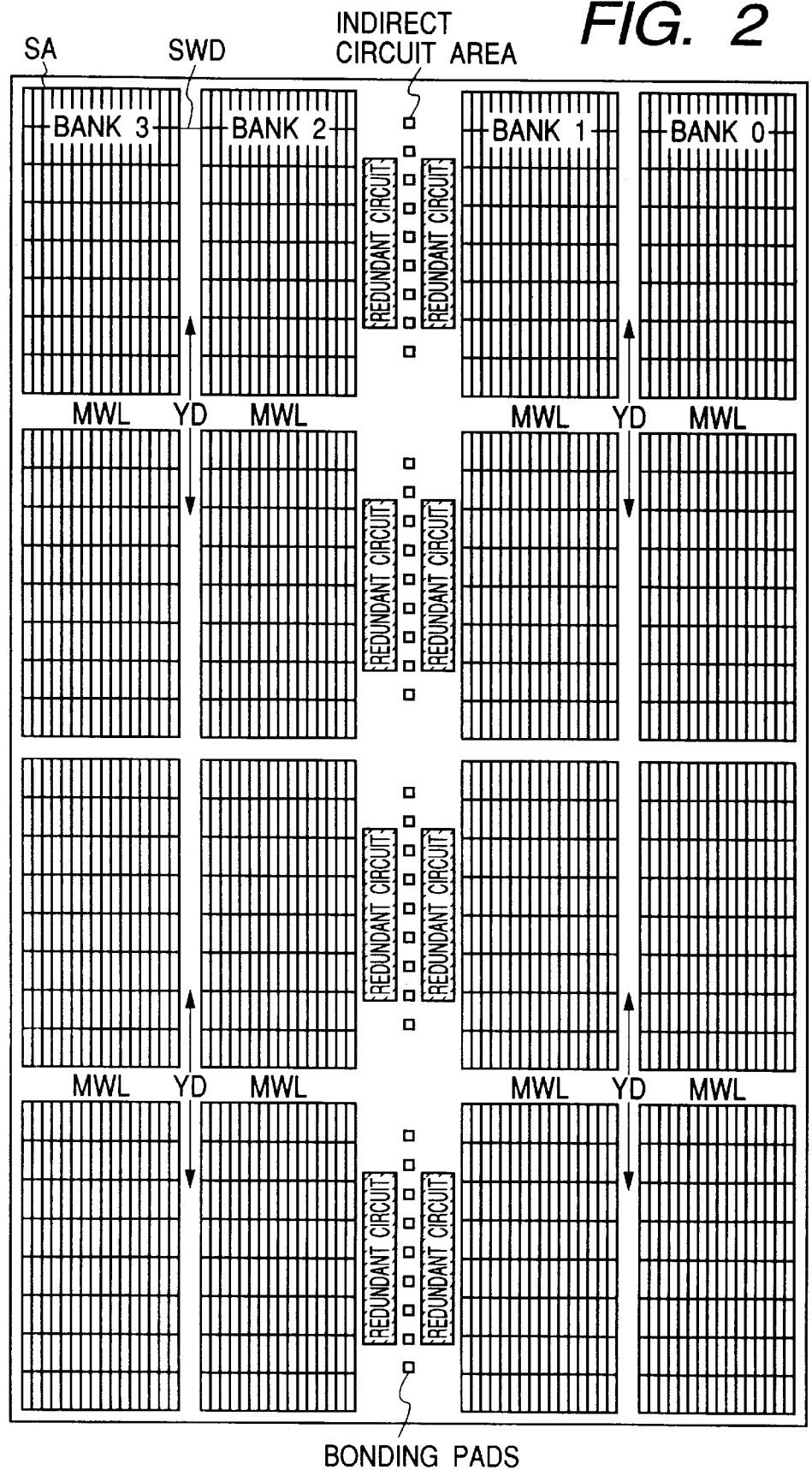
FIG. 2 is a schematic layout showing one embodiment of a dynamic RAM equipped with defect relief circuits, according to the present invention.

FIG. 2 is a schematic layout showing one embodiment of a dynamic RAM equipped with defect relief circuits (redundant circuits), according to the present invention. In the drawing, the dynamic RAM has four memory banks in association with the embodiment shown in FIG. 1. The drawing is principally shown so as to providing a more clear understanding of the configurations of the memory mats of the dynamic RAM. Their peripheral circuits are mostly simplified in configuration.

Although not a particular limitation in the present embodiment, a memory array is divided into four banks 0 through 3 as a whole. Four memory cell arrays are provided so as to be arranged in the longitudinal direction of a semiconductor chip. Since each memory bank has four memory cell arrays as described, sixteen memory cell arrays are configured over the entire chip. A central portion of the chip formed between the banks 2 and 1 is defined as an indirect circuit area. Bonding pads and redundant circuits indicated by ~ arranged in the vertical direction are illustratively shown as a typical example. An address buffer circuit, a data input buffer, a data output buffer, a clock generator, etc. are formed within the indirect circuit area in association with the bonding pads.

As to the layout of the individual memory arrays comprising the sixteen total arrays, which includes four in total provided in pairs on either side with respect to the longitudinal direction of the semiconductor chip and in groups of four in the vertical direction, as described above, the memory arrays are divided into pairs in the upper and lower central portions with respect to the longitudinal direction. Further, main word selection circuits MWLs are provided in the central portions divided pairs. Although not shown in the drawing, main word drivers are formed in the upper and lower areas of the main word selection circuits MWLs, which are adjacent to the respective memory cell arrays. The main word drivers respectively drive main word lines of the vertically-divided memory arrays. Y selection circuits YD are respectively provided between the memory cell arrays assigned to the banks 0 and 1 and between those assigned to the banks 2 and 3.

Each of the memory cell arrays has a plurality of memory mats arranged in the longitudinal direction and the direction normal to the longitudinal direction. Namely, one memory cell is divided into eight mats in the longitudinal direction so that eight memory mats are provided. Further, one memory cell is divided into sixteen mats in the direction normal to the longitudinal direction so that sixteen memory mats are provided. In other words, word lines are divided into groups of eight and bit lines are divided into groups of sixteen, respectively. Thus, the number of memory cells provided in each memory mat is represented in the form of the eight line division and the sixteen line division, so that memory access can be speeded up. As will be described later, the memory mats are constructed such that sense amplifier areas are placed from side to side with each memory mat interposed therebetween and sub-word driver areas are vertically placed. Sense amplifiers provided within the sense amplifier areas are configured in the form of a shared-sense system. Complementary bit lines are respectively provided on both sides of the sense amplifiers with the sense amplifiers as the centers, except for the sense amplifiers placed on both ends of the memory cell arrays. Further, the sense amplifiers are selectively connected to their corresponding complementary bit lines for any of the side-to-side extending memory mats.

The two memory arrays disposed in pairs by two as described above are provided such that the main word selection circuits MWL and main word drivers are placed in their central portions. Each of the main word selection circuits MWL is provided in common with respect to the two memory arrays distributed in the upward and downward directions with the main word selection circuit NWL at the center. Each individual main word driver forms or produces a signal for selecting a main word line which extends so as to penetrate or extend through the above-described one memory array. Further, sub-word selection drivers are also provided within the main word drivers, respectively. As will be described later, each sub-word selection driver extends in parallel to the main word line and produces a signal for selecting a corresponding sub-word select line.

Although not illustrated in the drawing, one memory mat includes 256 sub-word lines and complementary bit lines (or data lines) orthogonal thereto provided as 512 pairs. Since system memory mats are provided in a bit line direction in one memory array referred to above, about 8K sub-word lines are provided as a whole, and 16K are provided over the entire chip. On the other hand, since eight memory mats are provided in a word line direction one memory array, about 4K complementary bit lines are provided as a whole. Since four memory arrays are provided as a whole, 16K complementary bit lines are provided as a whole. The entire storage capacity is set so as to have a mass storage capacity of 16K×16K=256 Mbits.

The above-described one memory cell array is divided into eight along the direction of the main word line. Sub-word drivers (sub-word line driving circuits) are provided for each of the memory cell arrays divided in the above-described manner. The sub-word drivers are respectively divided into lengths each corresponding to one-eighth of the main word line. Each individual sub-word driver forms a signal for selecting a corresponding sub-word line extended in parallel thereto. In the present embodiment, although the invention is not restricted in particular, four sub-word lines are arranged for each main word line along the complementary bit-line direction to decrease the number of main word lines, in other words, to reduce the wiring pitch of each main word line. Each sub-word selection driver is placed to select one sub-word line from the sub-word lines divided into eight along the main word-line direction and is assigned in the complementary bit-line direction by four. The sub-word selection driver produces a signal for selecting one from the four sub-word select lines which extend in the direction in which the sub-word drivers are arranged.

If one takes note of one memory array referred to above, then the sub-word driver corresponding to one memory mat or memory cell array, including a memory cell to be selected, of the eight memory cell arrays assigned to one main word line, selects one sub-word select line. As a result, one corresponding sub-word line is selected from the sub-word lines corresponding to 32 lines=8×4 which belong to one main word line. Since 4k (4096) memory cells are provided in the main word line direction as described above, 4096/8=512 memory cells are electrically connected to one sub-word line. Although the invention is not restricted in particular, eight sub-word lines corresponding to one main word line are brought to a selected state in the case a refresh operation (e.g., a self-refresh mode).

As described above, each memory array has a storage capacity of 4 Kbits with respect to the complementary bit line direction. However, if the memory cells corresponding even to 4K are electrically connected to one complementary bit line, then the parasitic capacity of each complementary bit line increases and a signal level read based on the capacity ratio of the above capacity to the capacitance of a micro information storage capacitor would not be obtained. Therefore, the memory array is divided into sixteen parts even in the complementary bit line direction. Namely, the complementary bit lines are divided into sixteen parts by the sense amplifiers placed between the memory mats. The sense amplifiers are configured in accordance with the shared-sense system. The complementary bit lines are respectively provided on both sides of the sense amplifiers with the sense amplifiers 16 as the centers exclusive of the sense amplifiers placed at both ends of the memory cell array. Further, each of the sense amplifiers is selectively connected to any complementary bit line extending from side to side.

The redundant circuits are respectively provided in common with respect to the two memory banks 0 and 1, and 2 and 3. Namely, the above-described four memory cell arrays are arranged side by side in the longitudinal direction in the respective memory banks. The redundant circuits are provided four by four on both sides of the indirect circuit area so as to correspond to the memory banks 0 and 1, and 2 and 3.

Figure 3:
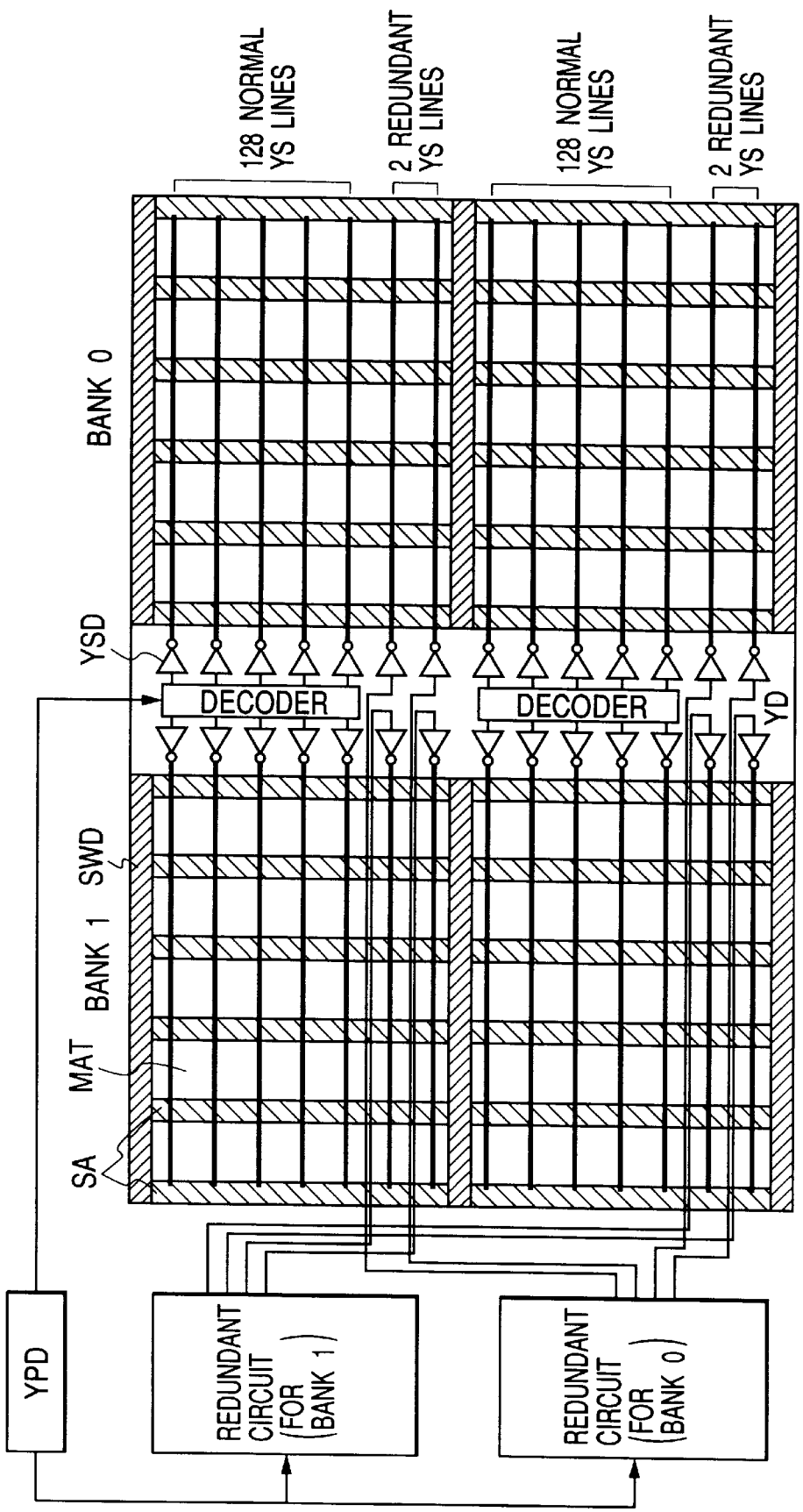
FIG. 3 is a block diagram for describing the relationship between the redundant circuits and respective memory mats shown in FIG. 2.

FIG. 3 is a block diagram for describing the relationship between the redundant circuits and the respective memory mats. In the drawing, ten memory mats corresponding to banks 1 and 0 are shown by way of illustrative example. While the respective banks are divided into sixteen memory mats in the bit line direction, as described above, only five memory mats thereof are shown as an illustrative example. While the banks are divided into eight memory mats in the word line direction, only two memory mats thereof are shown as an illustrative example. Sense amplifiers SA are respectively placed on both sides of the memory mats so as to separate the complementary bit lines from each other. Sub-word drivers SWDs are provided above and below so as to separate the word lines from one another.

In each memory mat, 128 column select lines YS are provided so as to correspond to 512 pairs of complementary bit lines. Further, two redundant column select lines YS are provided in correspondence to spare complementary bit lines. Namely, four pairs of complementary bit lines are selected by two pairs in accordance with one column select line YS. Column decoders YD are provided in the central portion of the memory array for separating the banks 0 and 1 from each other. Each of the column decoders YD is supplied with a pre-decode signal produced from a predecoder YPD. Further, the column decoders YD are provided with column drivers YSD for driving the column select lines YS, which are provided between the banks 0 and 1 according to the result of decoding thereof and which are provided in common with respect to the memory mats divided into sixteen and placed as described above.

Four redundant circuits are provided for the two-stage memory mats, such as for the banks 1 and 0. In association with the column decoders YSD for driving the column select lines YS, which are provided between the banks 0 and 1, redundant column select signals for selecting the spare complementary bit lines for the banks 1 and 0, which signals are produced by the redundant circuits, pass over the memory mats of the bank 1 and are transmitted thereto.

Figure 4:
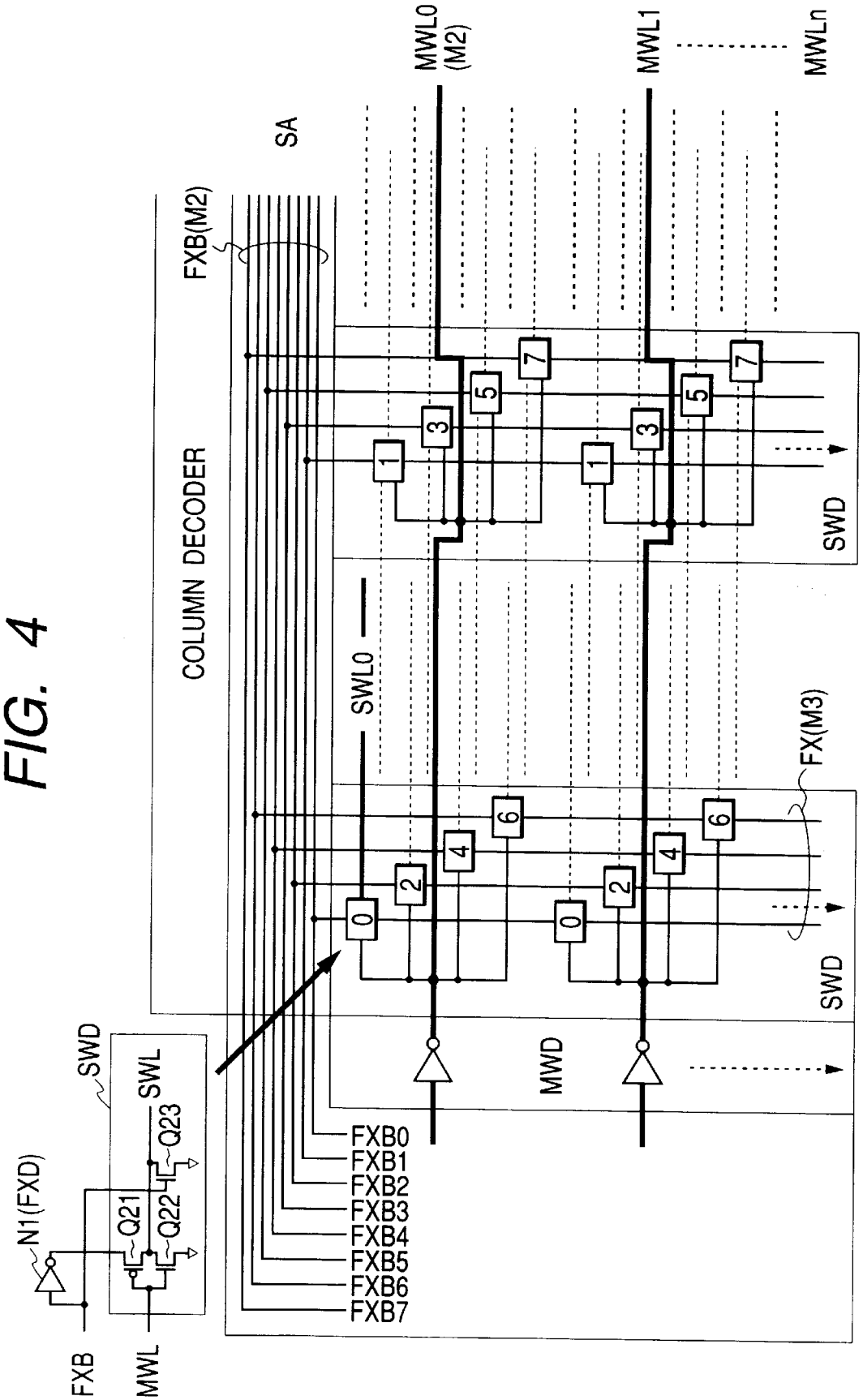
FIG. 4 is a fragmentary circuit diagram for describing the relationship between main word lines and sub-word lines of the memory mats shown in FIG. 3.

FIG. 4 is a fragmentary block diagram for describing the relationship between main word lines and sub-word lines of each memory mat. In the drawing, two main word lines MWL0 and MWL1 are illustrated as typical. The main word line MWL0 of these is selected by a main word driver MWD0. The main word line MWL1 is also selected by a main word driver similar thereto.

Eight pairs of sub-word lines are provided for the above-described one main word line MWL0 along the direction of its extension. In the drawing, the two pairs of sub-word lines are illustratively shown as typical. Eight sub-word lines SWL in total, which comprise those corresponding to even numbers 0 through 6 and those corresponding to odd numbers 1 through 7, are alternately placed in one memory mat. Exclusive of the even numbers 0 through 6 contiguous to each main word driver and odd numbers 1 through 7 placed on the far end side of the main word line (on the opposite side of the word driver), each sub-word driver SWD placed between the memory mats produces a signal for selecting one of the sub-word lines of the memory mats on both sides with the sub-word driver SWD as the center.

As described above, the memory mats are divided into eight in the main word line direction. However, since the sub-word lines corresponding to the two memory mats are substantially simultaneously selected by the corresponding sub-word driver SWD as described above, the memory mats are substantially divided into four. In the configuration in which the sub-word lines are divided into even numbers 0 through 6 and odd numbers 1 through 7 as described above and the sub-word drivers SWD are respectively placed on both sides of each memory mat, the substantial pitch of each of the sub-word lines SWL placed in high density in accordance with the placement of the memory cells can be reduced twice within the sub-word driver SWD. Thus, the sub-word drivers SWD and the sub-word lines SWL0 or the like can be laid out with efficiency.

The main word driver MWD drives the corresponding main word line for supplying a select signal to the four sub-word lines 0 through 6 (1 through 7) in common. A sub-word select line FX for selecting one of the four sub-word lines is provided. The sub-word select line FX comprises eight lines FX0 through FX7. Of these, the even-numbered sub-word select lines FX0 through FX6 are provided for the sub-word drivers 0 through 6 of the even-numbered row, whereas the odd-numbered sub-word select lines FX1 through FX7 of these are provided for the sub-word drivers 1 through 7 of the odd-numbered row. Although the invention is not restricted in particular, the sub-word select lines FX0 through FX7 are formed by a metal wired layer M2 corresponding to a second layer on the periphery of the memory cell array. Similarly, the sub-word select lines FX0 through FX7 are formed by a metal wired layer M3 corresponding to a third layer at portions where the main word lines MWL0 through MWLn formed by the metal wired layer M2 corresponding to the second layer intersect.

Figure 5:
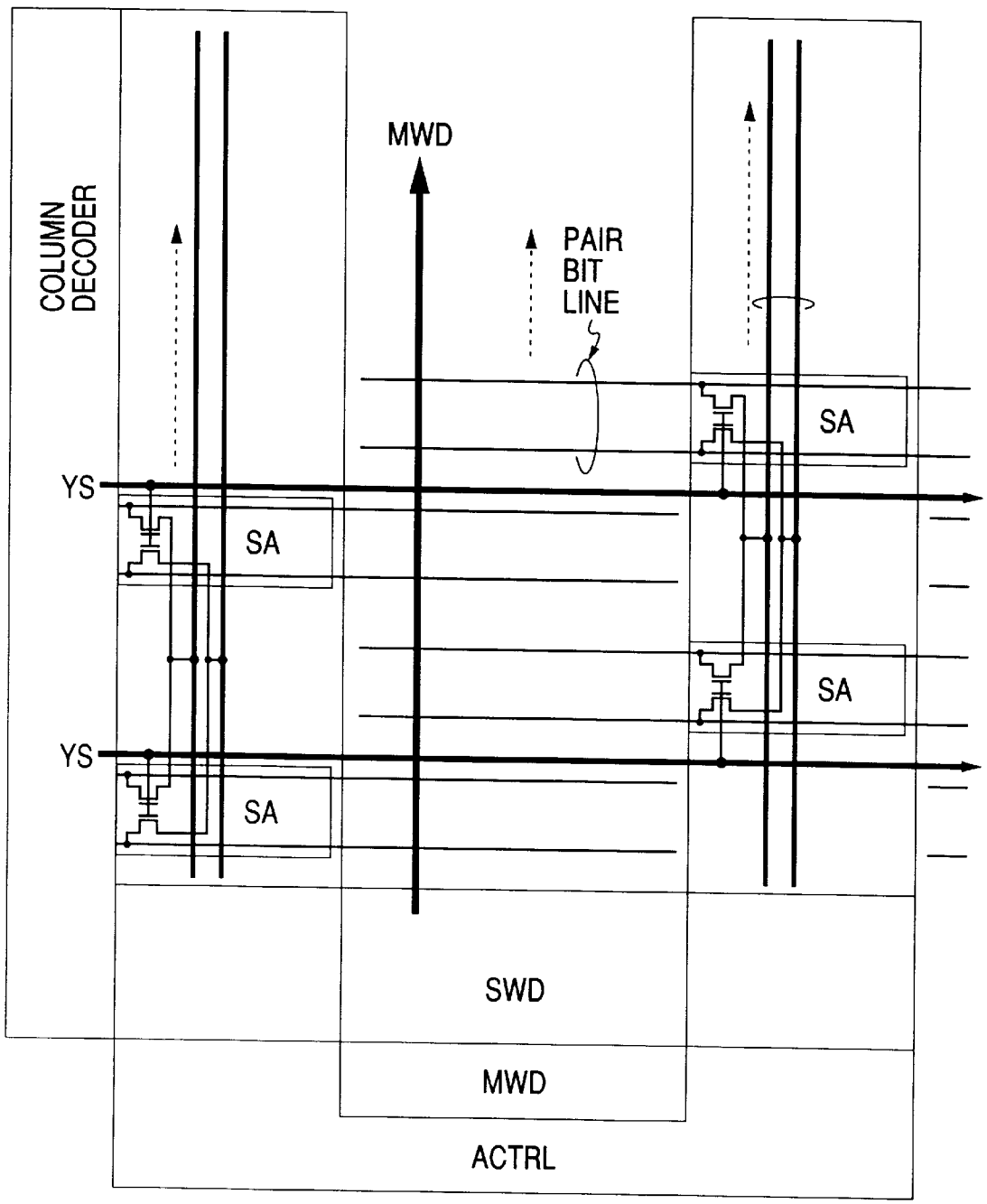
FIG. 5 is a fragmentary circuit diagram for describing the relationship between the main word lines and sense amplifiers shown in FIG. 4.

FIG. 5 is a fragmentary block diagram for describing the relationship between the main word lines and sense amplifiers. In the drawing, one main word line MWL is shown as typical. The main word line MWL is selected by its corresponding main word driver MOOD. A sub-word driver SWD corresponding to the even-numbered sub-word lines is provided adjacent to the main word driver MOOD.

Although omitted in the drawing, complementary bit lines (Pair Bit Line) are provided so as to intersect sub-word lines placed parallel to the main word line MWL. Although the invention is not restricted in particular in the present embodiment, the complementary bit lines are also divided into an even-numbered row and an odd-numbered row. Sense amplifiers SA are distributed to the left and right sides with the memory mat as the center so as to correspond to the divided complementary bit lines. While the sense amplifiers SA are configured as a shared-sense system, the sense amplifiers at the ends are not provided with complementary bit lines substantially on one side alone.

Since the complementary bit lines are distributed to the odd-numbered row and even-numbered row in the configuration wherein the sense amplifiers SA are placed on both sides of each memory mat in a distributed form as described above, the sense amplifier row can be reduced in pitch. If described reversely, then device areas for forming the sense amplifiers SA can be ensured while the complementary bit lines are being placed in high density. Local input/output lines are respectively placed along the arrangements of the sense amplifiers SA on both sides referred to above. The sense amplifiers SA have two pairs of local input/output lines respectively. As described above, the complementary bit lines provided by two pairs are selected according to the sense amplifiers placed on both sides of the memory mat by column switch MOSFETs switch-controlled by one column select line YS as described above, so that they are electrically connected to their corresponding local input/output lines provided by two pairs.

The local input/output lines provided as four pairs in total are electrically connected to four pairs of main input/output lines through a main switch circuit which is switch-controlled based on a mat select signal. The gate of each column switch MOSFET referred to above is electrically connected to the corresponding one column select line YS to which a select signal outputted from a column decoder (COLUMN DECODER) is transferred. The column select line YS is provided so as to extend through the memory mats divided into sixteen as shown in FIG. 2. The column select line YS is electrically connected in common to the corresponding gates of the column switch MOSFETs of each memory mat.

Figure 6:
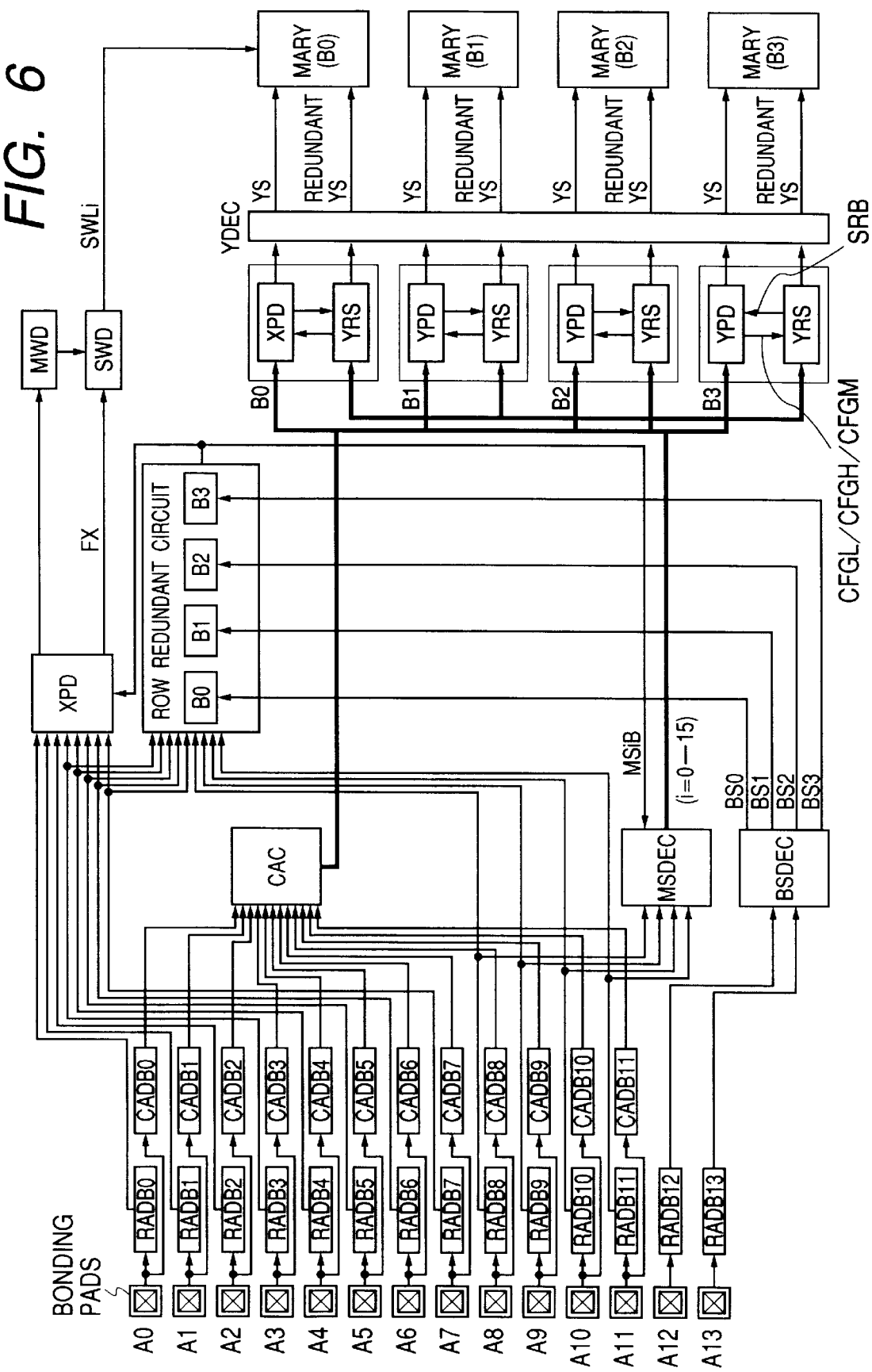
FIG. 6 is a schematic block diagram for describing a redundancy-system address selection circuit of the SDRAM shown in FIG. 2.

FIG. 6 is a schematic block diagram for describing a redundancy-system address selection circuit of the SDRAM.

Address terminals are provided so as to correspond to fourteen bonding pads A0 through A13. A row address buffer comprises buffer circuits RADB0 through RADB13 corresponding to the fourteen bonding pads A0 through A13. Address signals corresponding to the bonding pads A12 and A13 of the two highmost bits are regarded as bank select signals and are supplied to a bank selection circuit BSDEC. The bank selection circuit BSDEC produces each of the bank select signals BS0 through BS3, which selects one of the four memory banks B0 through B3. Since the redundant circuit is principally illustrated in the drawing, the above-described bank select signals are given as signals for respectively selecting redundant circuits B0 through B3 corresponding to respective banks of a row redundant circuit.

Address signals corresponding to the remaining bonding pads A0 through A11 are used to select one of the memory mats divided into sixteen by address signals A8 through A11 corresponding to the four leftmost bits. These 4-bit address signals A8 through A11 are supplied to a mat selection circuit MSDEC from which sixteen types of mat select signals MSiB are formed. Namely, memory mats equivalent to 8×4=32 placed in the longitudinal direction of the chip are respectively selected by the sixteen types of mat select signals MSiB. The mat select signals MSiB are used to select one word line (sub-word line) of 256 word lines provided in the memory mat by the remaining address signals A0 through A7 comprised of eight bits. Namely, the address signals A0 through A7 are inputted to a row pre-decoder XPD where they are predecoded, whereby the above one sub-word line SWLi for each memory mat provided in the corresponding memory cell array MARY is selected by a main word driver MWD and a sub-word driver SWD supplied with the sub-word line select signal FX.

The row redundant circuit receives the bank select signals BS0 through BS3 and the address signals A0 through A11. When any of the received signals coincides with a faulty or defective address stored in the row redundant circuit, the row redundant circuit stops the selecting operation of the sub-word line SWLi and performs switching to the operation of selecting an unillustrated redundant word line. Although the selecting operation of the redundant word line is not a requirement of the invention, a redundant circuit is provided for each main word line. Namely, if any of a plurality of sub-word lines corresponding to one main word line in each memory mat is found to be faulty, then the main word line and all the plurality of sub-word lines corresponding to the main word line are switched to spare word lines, respectively.

A column address buffer comprises buffer circuits CADB0 through CADB11 in association with bonding pads A0 through A11, excluding the bonding pads A12 and A13, for specifying the corresponding bank, of the fourteen bonding pads A0 through A13. Of these, the above-described 128 column select signals YS are formed by the address signals A0 through A6 corresponding to the seven rightmost bits. In the thirty-two memory mats in total, which are stacked on one another in the longitudinal direction of the chip, each of the column select lines YS provided for the memory mats one by one is brought into a selected state.

A word line in one of the system memory mats is brought to a selected state by the row-system address signal. Two sense amplifiers interposing the memory mat therebetween are activated to amplify a read signal on the complementary bit line pair and latch it therein. In the remaining fifteen memory mats, word lines are placed in a non-selected state and correspondingly sense amplifiers are also in a non-operating state. Therefore, the complementary bit lines for these nonselected memory mats and input/output nodes of the sense amplifiers are both placed in a floating state and kept at a half precharge potential. Thus, when the column select line YS common to the sixteen memory mats is kept in the selected state, the complementary bit lines and the input/output nodes of the sense amplifiers are respectively connected to one another in the respective memory mats. Further, the complementary bit lines are respectively simply connected to local input/output lines each kept in a floating state.

In the selected memory mat, the four pairs of complementary bit lines are electrically connected to four pairs of local input/output lines. Further, the four pairs of local input/output lines are electrically connected to their corresponding main input/output line according to the mat select signals. The main input/output line is electrically connected to an input terminal of each main amplifier. In the above-described configuration, each of the read signals represented by four bits is introduced into the input of the main amplifier from each memory mat. Although the invention is not restricted in particular, the main amplifiers are respectively commonly provided for the banks 0 and 1 and banks 2 and 3. Namely, the same main amplifiers are shared between the banks 0 and 1. Since 8×4=32 respective memory mats are provided in the longitudinal direction and selected by four bits from the respective memory mats on the basis of the column addresses A0 through A6, 128 main amplifiers are provided for the banks 0 and 1 as a whole.

The address signals corresponding to A7 through A11 comprised of the five leftmost bits are used to form or produce signals for selecting the main amplifiers. Thus, 32 types of select signals are produced from the address signals. Namely, sixteen main amplifiers are selected and are capable of reading data in units of 16 bits. Even in the case of write operations, write circuits are provided so as to correspond to the 16 bits referred to above. The column-system address signals A0 through A11 are inputted to a column address counter CAC from which the column-system address signals are supplied to respective Y-system selection circuits of the banks B0 through B3.

Column pre-decoders YPD are supplied with address signals held by the column address counter CAC or produced by being incremented thereby. The column redundant circuits YRS are supplied with the mat select signals MSiB. Thus, defective bit lines are relieved in mat units. Each of the pre-decode signals CFGL/CFGH/CFGM produced from each column pre-decoder YPD is supplied to its corresponding column redundant circuit YRS. The column redundant circuit YRS stores mat addresses therein, compares each mat address and the mat select signals MSiB and makes a decision as to the result of comparison. If a defective bit line is found to exist in the selected memory mat, then the column redundant circuit YRS makes a comparison between the predecode signals CFGL/CFGH/CFGM and the stored corresponding information about each defective bit line. If they are found to coincide with each other, then the column redundant circuit YRS generates a coincidence signal SRB to thereby make the output of the corresponding column predecoder YPD ineffective, thus allowing the corresponding redundant line YS to be placed in a selected state as an alternative.

Figure 7:
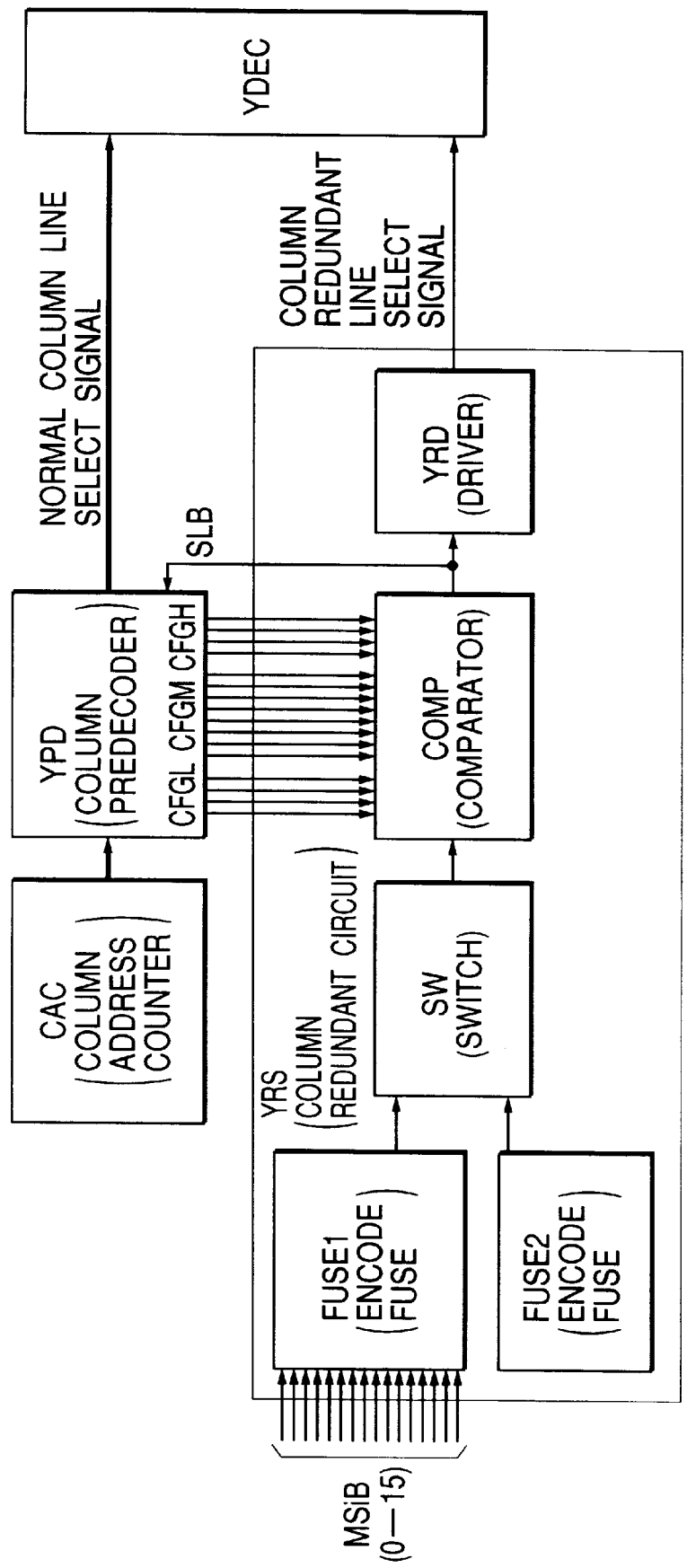
FIG. 7 is a detailed block diagram showing a column redundant part shown in FIG. 6.

FIG. 7 is a detailed block diagram of the column redundant unit or part. The column redundant circuit YRS has two encode fuses FUSE1 and FUSE2. The first encode fuse FUSE1 stores encoded mat address information therein. The stored mat address information is set to have binary weights corresponding to the row-system mat address signals A8 through A11 shown in FIG. 6. The encode fuse FUSE1 consists of four fuses in association with mat address information indicative of the presence of each defective bit line.

The stored information read from the encode fuse FUSE1 is used to control a switch tree corresponding to their weights. Such a switch tree is supplied with the decoded sixteen (0 to 15) types of mat select signals MSiB. The switch tree brings a switch circuit SW into an on state in accordance with a signal corresponding to the coincidence between the stored defective mat information and the specified mat select signal. The switch circuit SW selects defective bit information stored in a second encode fuse FUSE2 and transfers it to one input of a comparator COMP. Although the invention is not restricted in particular, the defective bit information is regarded as signals corresponding to binary weights corresponding to the address terminals A0 through A6 shown in FIG. 6. Therefore, the second encode fuse FUSE2 comprises seven fuses.

The comparator COMP is provided with decoder circuits for pre-decoding the defective bit information. Supplied to the other input of the comparator COMP are pre-decode signals CFGL, CFGM and CFGH outputted from the column predecoder YPD supplied with the address signals supplied through the column address counter CAC or produced from the column address counter CAC. Namely, the comparator COMP compares the pre-decode signal corresponding to the defective bit line and each memory-accessed pre-decode signal and makes a decision as to the coincidence or noncoincident therebetween. If they are found to coincide with each other from the result of comparison, then the comparator COMP renders a signal SLB low in level to make the output of the pre-decoder YPD ineffective. As an alternative to this, a column redundant driver YRD supplies a column redundant line select signal to its corresponding Y decoder YDEC of each memory mat.

In the above-described construction, the defective bit lines are stored as mat address information and bit address information as binary information. The first and second encode fuses FUSE1 and FUSE2 can be made up of a less number corresponding to eleven in total. Since the defective bit lines are relieved for all memory mats, the same redundant bit lines can be commonly used to relieve defective bit lines for different addresses on condition that the mat addresses differ from one another. Thus, the efficiency of relief provided for the defective bit lines by the redundant circuits can be increased. Incidentally, twice as many is needed, such as 22, when the defective bit lines specified by the above eleven bits are provided so as to correspond to true and bar signals of complementary address signals.

Figure 8:
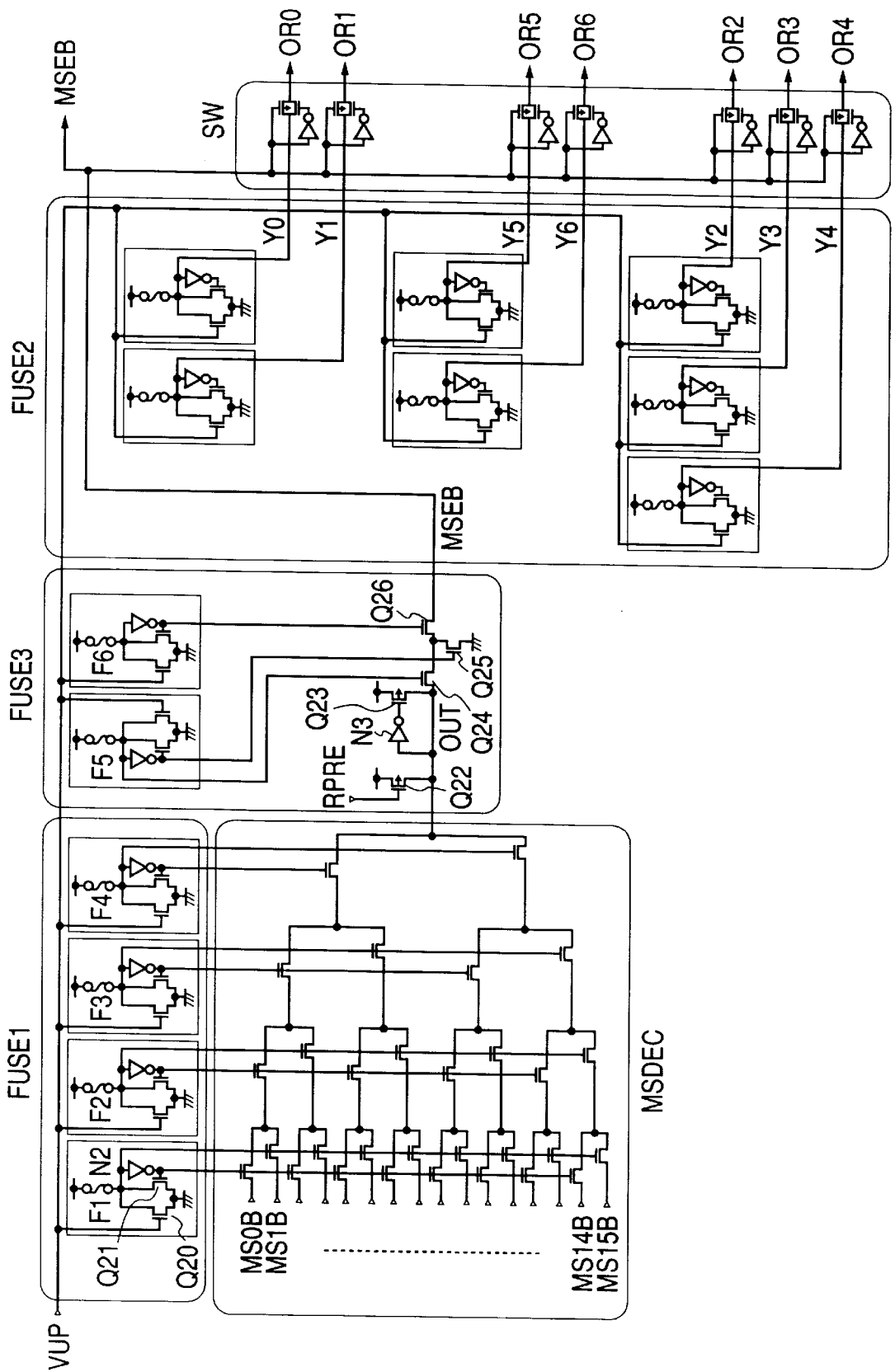
FIG. 8 is a detailed partial circuit diagram illustrating a portion of the column redundant part shown in FIG. 7.
Figure 9:
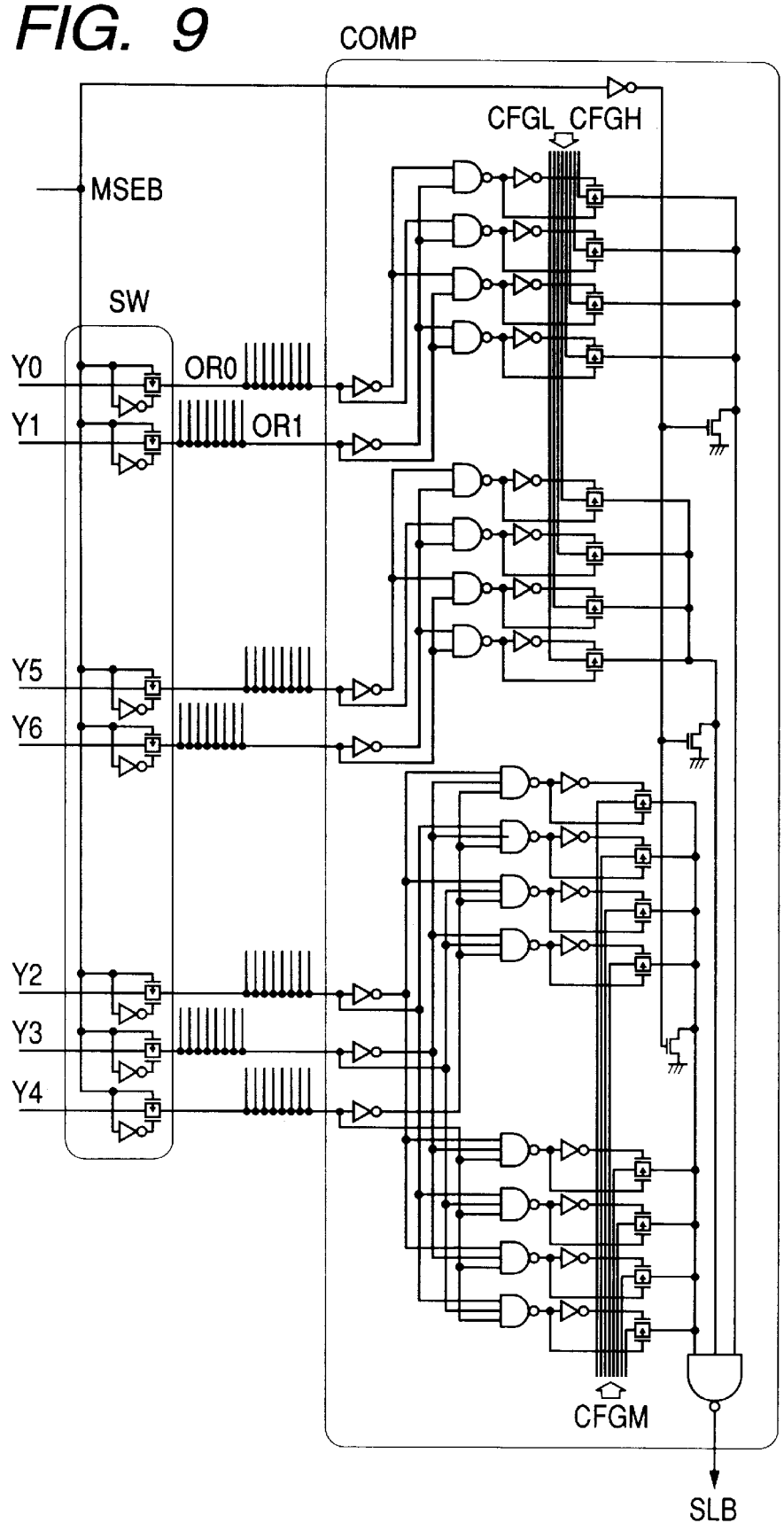
FIG. 9 is a detailed partial circuit diagram depicting the remaining portion of the column redundant part shown in FIG. 7.

FIGS. 8 and 9 are respectively detailed circuit diagrams of the column redundant part referred to above. A portion of the switch circuit SW is shown in both drawings in overlapping form to provide easy understanding of the relationship between FIGS. 8 and 9. In FIG. 8, a first encode fuse FUSE1 consists of four fuses F1 through F4 as described above. Namely, one end of the fuse F1 is electrically connected to a power terminal. A MOSFET Q20 turned ON by a signal VUP temporarily brought to a high level upon power-on is provided between the other end thereof and a ground potential of the circuit. A latch circuit is configured wherein the input of an inverter N2 is supplied with a voltage applied to the other end of the fuse F1, a signal outputted from the inverter N2 is supplied to the gate of a MOSFET Q21 provided in parallel to the MOSFET Q20, and a low level at the time that the fuse FUSE1 opens is latched therein. The inverter N2 is used to constitute the above-described latch circuit and to form address signals complementary to the input and output thereof. Other fuses F2 through F4 are provided with inverters and MOSFETs, respectively.

Complementary read signals formed according to the presence or absence of opening of the four fuses F1 through F4 constituting the fuse FUSE1 are supplied to a comparator MSDEC comprised of a switch tree made up of MOSFETs. The fuses F1 through F4 are associated with their corresponding address signals A8 through A11 when they have opened. The fuses corresponding to low levels of the address signals are allowed to open. When all the fuses F1 through F4 are open, for example, each of the address signals A8 through A11 corresponds to a low level and a low level of a mat select signal MS0B is transmitted through the switch tree. Ones of the mat select signals MS0B through MS15B, which correspond to the selected memory mat, result in a low level, and the others thereof result in a high level.

Thus, if the mat select signal MS0B is low in level in a state in which the fuses F1 through F4 are all open, then an output OUT of the switch tree MSDEC, which substantially serves as a comparator, is rendered low in level. Prior to the memory access, the output OUT is precharged to a high level by a P channel MOSFET Q22, which is turned ON in response to a low level of a signal RPRE. The precharged potential is latched by an inverter N3 and a P channel MOSFET Q23. Thus, when a high level of a signal corresponding to a nonselected memory mat is transferred through a transmission path of the switch tree used as the comparator, the output OUT is brought to a non-select level corresponding to a high level non-coincidence signal. When the low level of the mat select signal is transmitted through the transfer path of the switch tree as described above, the output OUT is brought to a low level corresponding to a coincidence signal.

When defective ones are found to exist in the column select signals YS, all the same bit line addresses of the respective memory mats would result in failure at the output portion OUT. Therefore, when the sixteen mat addresses are sequentially stored, sixteen sets of fuses are needed correspondingly. To avoid this, a fuse F5 is provided. A fuse F5 is a fuse for making all the memory mats defective. When the fuse F5 is allowed to open, a switch MOSFET Q24 series-inserted into the output OUT is turned OFF and a switch MOSFET Q25 for allowing the output signal to be low in level is turned ON. It is thus possible to store defective addresses corresponding to sixteen memory mats therein regardless of the fuses F1 through F4.

A fuse F6 is used to store information as to whether effective stored information is written into the fuses F1 through F4 or F5. When the fuse F6 remains unopen, a low level signal is produced to turn OFF a MOSFET Q26 provided in series with the MOSFET Q24, so that the transmission of the output signal delivered from the switch tree is rendered ineffective. When the fuse F6 is caused to open, a high level signal is produced to turn ON the MOSFET Q26 provided in series with the MOSFET Q24, so that a relief mat coincidence signal MSEB corresponding to the opening of the switch tree or the fuse F5 is outputted.

The relief mat coincidence signal MSEB is used as a switch control signal of the switch circuit SW. Namely, the relief mat coincidence signal MSB is rendered low in level upon coincidence so that P channel MOSFETs of the switch circuit SW are turned ON. N channel MOSFETs parallel-connected to the P channel MOSEETs are turned ON by signals inverted by inverters supplied with the relief mat coincidence signal MSEB. Thus, the switch circuit SW is made up of CMOS switch circuits and outputs defective bit address signals corresponding to the column-system address signals Y0 through Y6 constituting the fuse FUSE2.

Referring to FIG. 9, outputs produced through a switch circuit from a plurality of fuses similar to the above are commonly connected on the output side of the switch circuit SW. Namely, the output side thereof takes a wired-ORed logical configuration. One of the fuses of the switch circuit SW is turned ON when a memory access is made to memory mats in which defective bit lines exist. When no defective bit lines exist therein, any of them is placed in an OFF state. Therefore, the above-described wired OR logic can be used. Since there are sixteen memory mats, sixteen pairs of fuses FUSE1 through FUSE3 are needed to relieve the defective bit lines in the sixteen memory mats. In the present embodiment, nine pairs of fuses are provided in consideration of the presence of memory mats having defect-free bit lines and the wired-OR logic is taken on the output side of the switch circuit SW.

A comparator COMP is provided with pre-decoder circuits for pre-decoding the wired-OR signals OR0 through OR6. Namely, the two rightmost bits OR0 and OR1 are combined together to produce or form four types of predecode signals. The three middle bits OR2 through OR4 are utilized in combination to produce eight types of pre-decode signals. Further, the two leftmost bits OR5 and OR6 are combined together to produce four types of pre-decode signals. These pre-decode signals are used as signals for controlling CMOS switch circuits similar to the above.

The inputs of the CMOS switch circuits are used to transfer pre-decode signals CFGL, CFGM and CFGH obtained by pre-decoding column addresses inputted for memory access. In this case, a selected one of the CMOS switch circuits is turned ON so that a high level select signal is transmitted as a coincidence signal. When all of the three pairs of pre-decode signals coincide with each other, a NAND gate circuit G1 provided at an output portion produces a low level coincidence signal SLB.

The two sets of comparators COMP are provided in the present embodiment. Namely, the two sets of comparators COMP are provided so as to correspond to one memory block comprised of the sixteen memory mats extending in the transverse direction and the eight memory mats extending in the longitudinal direction. Since eight sets of fuses are provided for the respective comparators COMP, eighteen sets of fuses are provided as a whole. Since four sets of redundant circuits are provided from side to side in association with the memory cell arrays of the two banks 0 and 1 or 2 and 3 as shown in FIG. 2, a large number of fuses, such as 18×8=144 sets, are provided over the entire chip.

As described above, the redundant circuits are commonly provided as in the case of the two banks 0 and 1 or 2 and 3, and the redundant circuits corresponding to the two circuits are provided in their banks. Since the two redundant column select lines YS are respectively provided for the memory mats, other redundant column select lines are used to relieve defective redundant column select lines YS when the defects have occurred in the redundant column select lines YS. If no defective bit lines occur in one bank, then the two sets of comparators can be used in one memory bank. If defects occur in bit lines of the same addresses lying within the memory mats of the same addresses in the two memory banks, then one circuit referred to above can relieve both.

Figure 10:
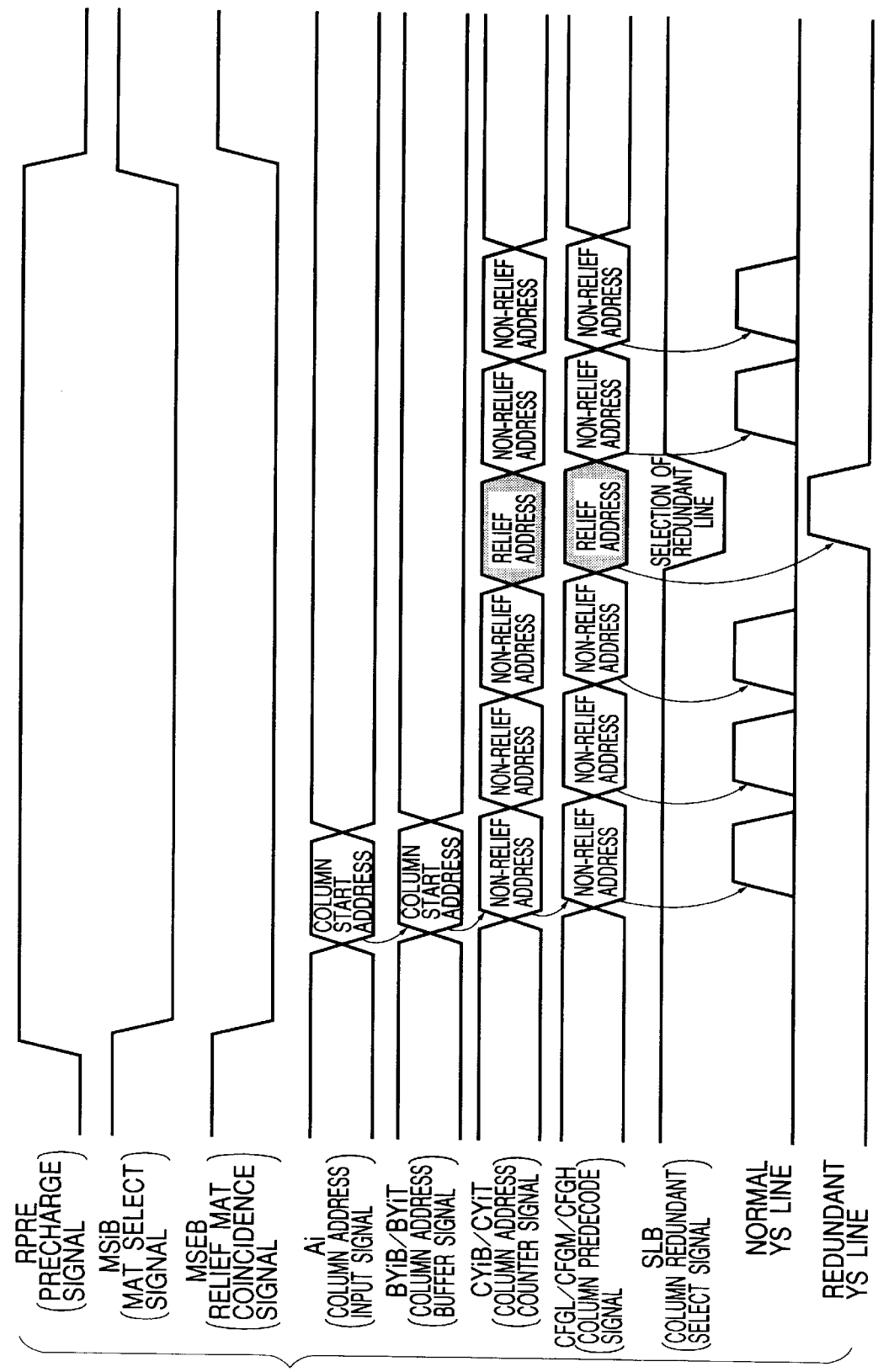
FIG. 10 is a timing diagram for describing one example of the SDRAM according to the present invention.

FIG. 10 is a timing chart for describing one example of an SDRAM according to the present invention. A precharge signal PREF is rendered low in level prior to the memory access. The precharge signal PREF- precharges the output OUT of the switch tree (corresponding to the comparator for making a comparison to the mat select signals) MSDEC shown in FIG. 8 to a high level. The signal PREF is rendered high in level by the memory access so that the precharge P channel MOSFET Q22 is turned OFF. The output OUT is maintained at a high level by the latch circuit.

The row-system selecting operation is performed in accordance with the above operation of the SDRAM and hence one mat select signal MSiB is brought to a low level. When defective bits exist in the selected memory mat, the relief mat coincidence signal MSEB is rendered low in level. Namely, the relief mat coincidence signal MSEB is already rendered low in level prior to the column-system selecting operation. As a result, the addresses Y0 through Y6 corresponding to the defective bit lines are read to switch-control the corresponding comparator COMP. Thus, even if a circuit like the switch tree, which needs time for signal transmission, is used as the comparator for making a comparison between the pre-decode signals and the mat select signal, the column selecting operation is not delayed.

The column address (start address) signals Ai supplied from the external terminals are brought to the column address counter through the column address buffers. The signals outputted from the column address counter are predecoded and the comparator COMP performs the required comparison and decision. When non-relief addresses are given, the column redundant select signal SLB is high in level so that the normal YS line is selected. When a relief address is given as is the case in the fourth cycle at burst reading, the column redundant select signal SLB is low in level so that the normal YS line is not selected. As an alternative to this, the corresponding redundant YS line is brought to a selected state corresponding to a high level. When the non-relief addresses are given the fifth cycle or later, the column redundant select signal SLB results in a high level so that the normal YS line is selected.

Figure 11:
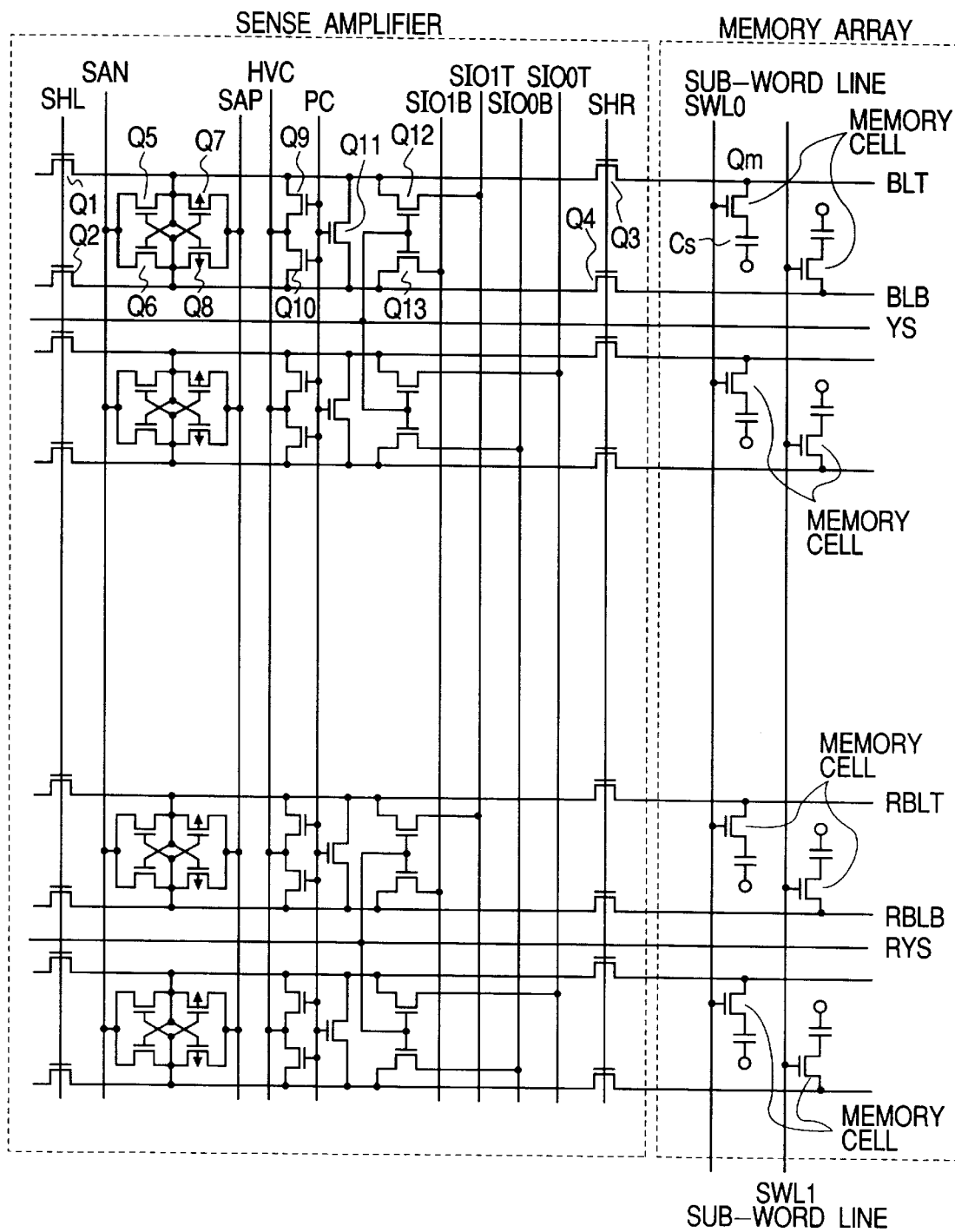
FIG. 11 is a fragmentary circuit diagram showing one embodiment of a sense amplifier part of the SDRAM according to the present invention.

FIG. 11 is a fragmentary circuit diagram showing a sense amplifier part of the SDRAM according to the present invention. A sense amplifier and one memory mat (memory array) related thereto are illustratively shown in the drawing. The memory mat placed on the left side of the sense amplifier is omitted. Further, shared switch MOSFETs (Q1 and Q2) and the like electrically connected to complementary bit lines thereof are shown by way of illustrative example.

Four normal circuits and four redundant circuits are illustratively shown in association with sub-word lines SWL0 and SWL1 provided within the right-side memory mat as typical of the dynamic memory cells. Each individual dynamic memory cell comprises an address selection MOSFET Qm and an information storage capacitor Cs. The gate of each address selection MOSFET Qm is electrically connected to the sub-word line SWL0, whereas the drain of the MOSFET Qm is electrically connected to one BLT of the complementary bit lines BLT and BLB. Further, each information storage capacitor Cs is electrically connected to the source of the MOSEET Qm. Other electrodes of the information storage capacitors Cs are commonly used and supplied with a plate voltage.

A pair of complementary bit lines BLT and BLB is provided in parallel as shown in the drawing. Further, the complementary bit lines BLT and BLB are caused to suitably intersect as needed to strike a capacity balance or the like between the bit lines. Such complementary bit lines BLB and BLT are respectively electrically connected to input/output nodes of a unit circuit of the sense amplifier by shared switch MOSFETs Q3 and Q4. Each unit circuit of the sense amplifier comprises N channel MOSFETs Q5 and Q6 and P channel MOSFETs Q7 and Q8 whose gates and drains are respectively cross-connected and configured in latch form. The sources of the N channel MOSFETs Q5 and Q6 are respectively electrically connected to a common source line SAN. The sources of the P channel MOSFETs Q7 and Q8 are respectively electrically connected to a common source line SAP. Power switch MOSFETs comprised of N channel MOSFETs and P channel MOSFETs are respectively provided for the common source lines SAN and SAP. The power switch MOSFETs are turned ON in response to an activation signal of the sense amplifier so as to supply a voltage required to activate the sense amplifier.

Precharge circuits each comprised of a MOSFET Q11 for short-circuiting the complementary bit lines and switch MOSFETs Q9 and Q10 for supplying a half precharge voltage HVC to the complementary bit lines are provided at the input/output nodes of the unit circuits of the sense amplifier. The gates of these MOSFETs Q9 through Q11 are commonly supplied with a precharge signal PC.

MOSFETs Q12 and Q13 constitute column switches which are switch-controlled by column select signals YS, respectively. In the present embodiment, the two pairs of bit lines can be selected by one column select signal YS. When the sub-word line SWL0 of the memory mat on the right side is selected, a sense amplifier similarly placed even on the right side with the memory mat as the center is also activated. Column switch MOSFETs similar to the above are provided even within the unillustrated right sense amplifier to select two pairs of bit lines. Therefore, noting one memory mat will result in selection of complementary bit lines of four pairs in total.

Namely, if attention is paid to the memory mat, then the two sense amplifiers are placed on both sides of the bit lines and the bit lines are alternately connected to the two sense amplifiers by two pairs in association with the two sense amplifiers. The column select signal YS is capable of selecting four pairs of complementary bit lines in total corresponding to the two pairs of bit lines BLT and BLB shown by way of illustrative example in the sense amplifier and the remaining unillustrated two pairs of bit lines provided in the unillustrated sense amplifier. These two complementary bit line pairs are respectively electrically connected to local input/output lines SI00B, SI00T and SI01B and SI01T. Even in the case of the unillustrated sense amplifier, the complementary bit line pairs are respectively electrically connected to local input/output lines SI02B, SI02T and SI03B, SI03T and connected to four pairs of main input/output lines in total in accordance with each mat select signal. Similarly to the above, sense amplifiers and redundant bit lines RBLT and RBLB and the like are provided even for a redundant column select line RYS.

Figure 12:
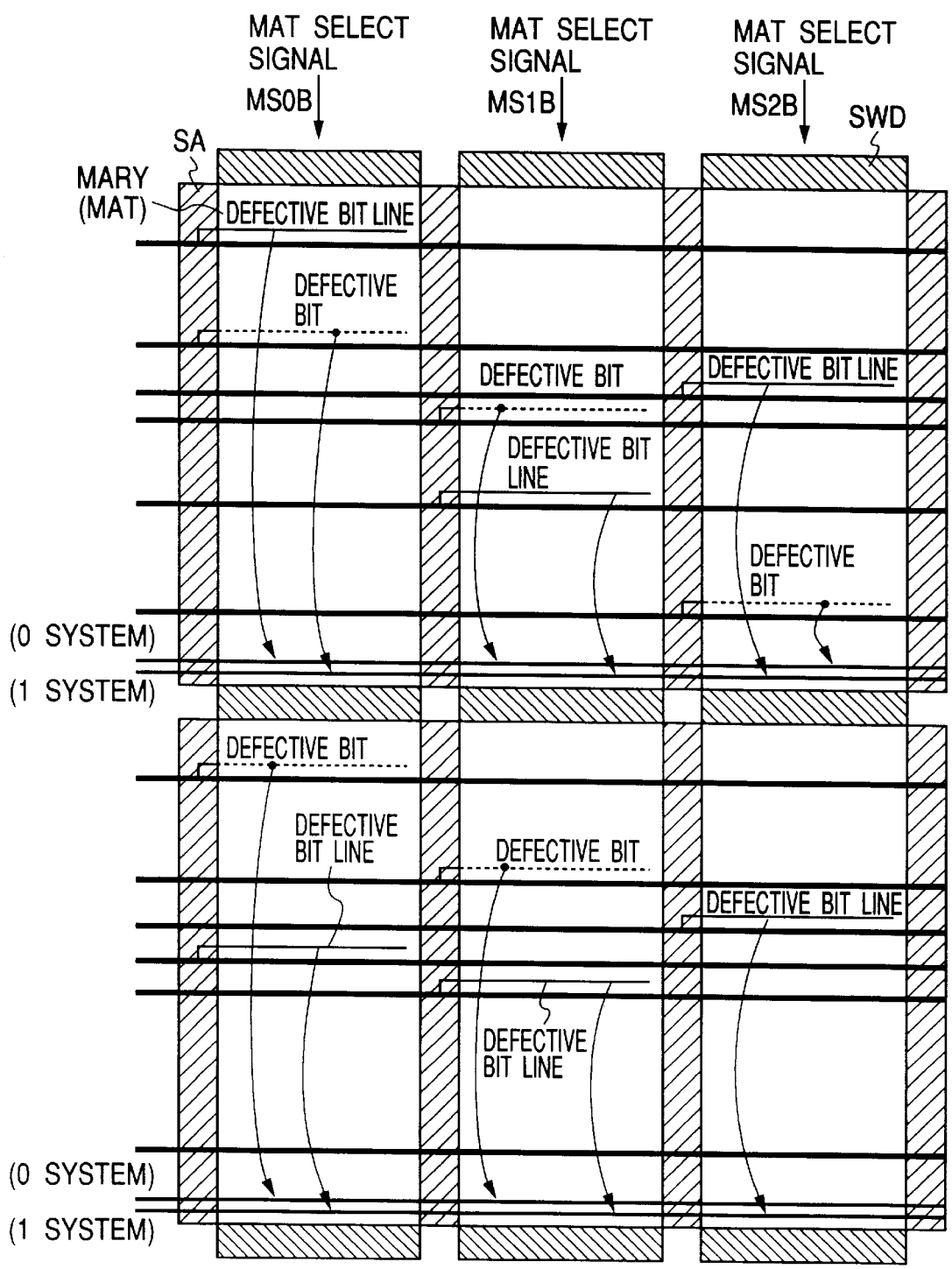
FIG. 12 is a configurational diagram for describing a failure or defect relieving method employed in the SDRAM according to the present invention.

FIG. 12 is a configurational diagram for describing a failure or defect relieving method employed in the SDRAM according to the present invention. In the drawing, six memory mats in total comprising three memory mats extending in a bit line direction by two memory mats extending in a word line direction are illustratively shown in the drawing. The present embodiment shows an example in which ones defective over their entirety like the breaking of bit lines or the like, of defective bit lines indicated by solid lines in the memory mat on the upper side in association with the mat MS0B, are switched to a 0-system redundant circuit, and ones defective in memory cells connected to bit lines indicated by dotted lines as in the bit lines indicated by the dotted lines, are switched to a 1-system redundant circuit because of the use of the 0-system redundant circuit. In the memory mat provided on the lower side in association with the mat MS0B, defective bit lines indicated by solid lines different from the above are switched to a 1-system redundant circuit and defective bit lines indicated by dotted lines are switched to a 0-system redundant circuit. Other illustratively-shown memory mats MS1B and MS2B and the like are also handled in the same manner as described above. In the banks 0 and 1, the total number of relievable defective bit lines is determined depending on the number of redundant decoders. If the number of redundant decoders connected to the 0-system and 1-system redundant circuits is supposed to be nineteen, for example, then nineteen defective bit lines can be relieved as a whole on condition that two defective bit lines are relieved at a maximum in one memory mat.

Figure 13:
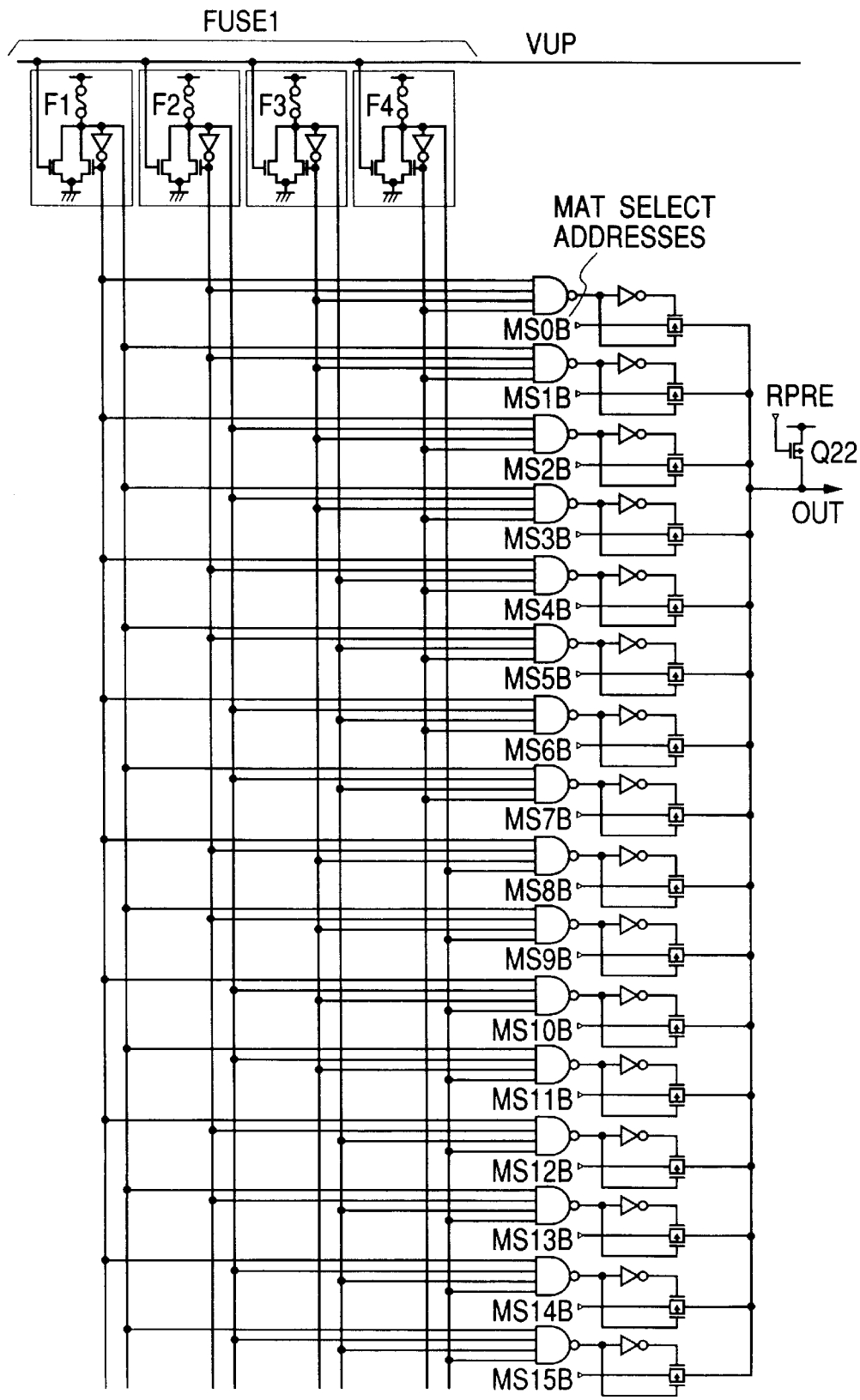
FIG. 13 is a circuit diagram showing another embodiment of the portion of the column redundant part shown in FIG. 7.

FIG. 13 is a circuit diagram showing another embodiment of the column redundant part. The present embodiment shows a comparator part associated with mat select signals corresponding to the encode fuse FUSE1 employed in the above-described embodiment. Complementary read signals formed in association with the presence or absence of opening of the four fuses F1 through F4 constituting the fuse FUSE1 are respectively supplied to four-input NAND gate circuits corresponding to sixteen combinations, where they are decoded into sixteen signals. These sixteen decoded signals are used as signals for switch-controlling sixteen CMOS switch circuits and they allow the CMOS switch circuits to transfer the mat select signals MS0B through MS15B placed in one-to-one correspondence with them. As described above, ones selected from the mat select signals MS0B through MS15B are low in level and others are all high in level. Thus, if a memory mat corresponding to a memory mat in which defective bit lines specified by the fuse F1 through F4 exist, is selected, then an output signal OUT is rendered low in level and others become high in level in the same manner as described above.

Figure 14:
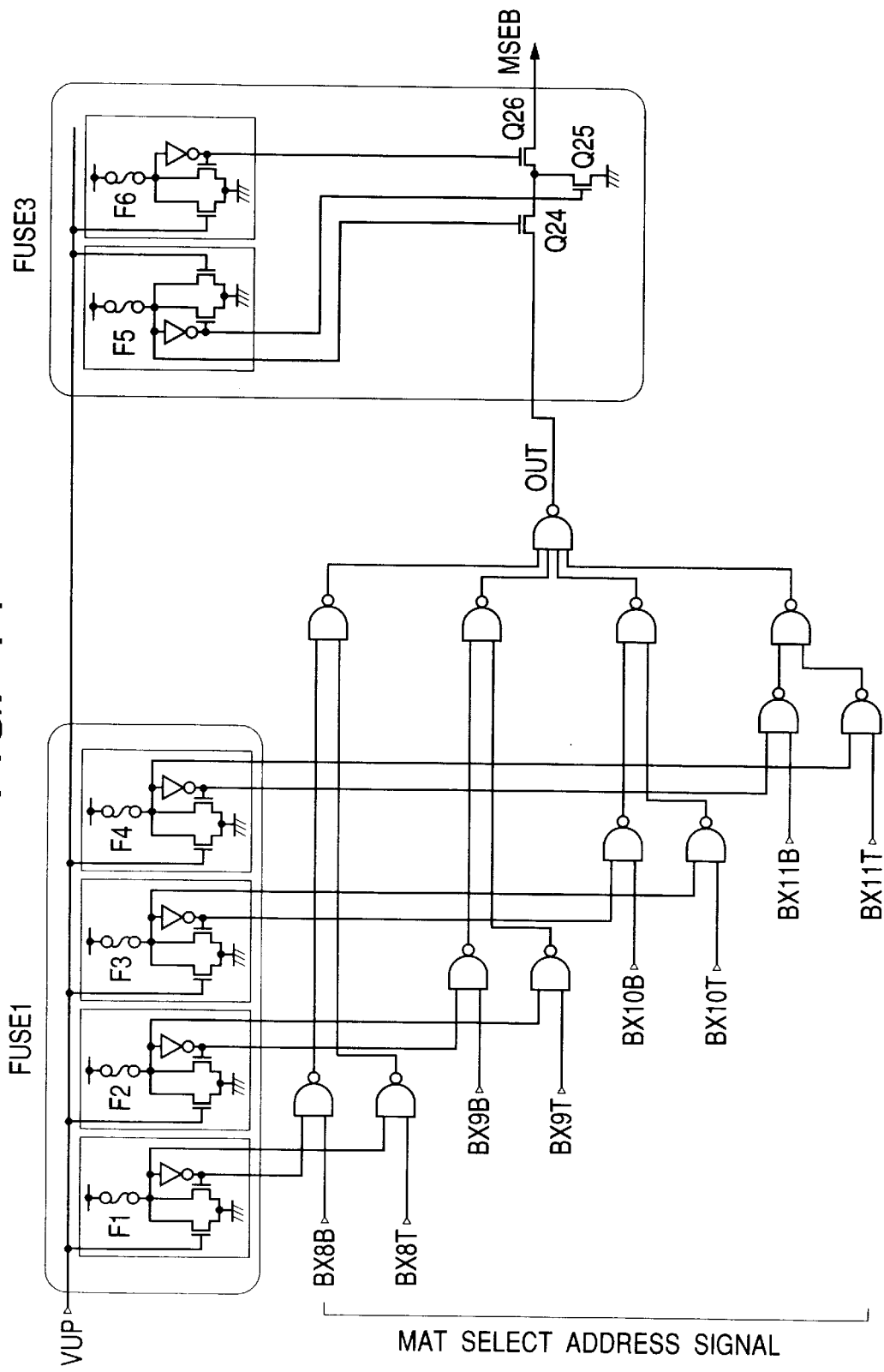
FIG. 14 is a circuit diagram illustrating a further embodiment of the portion of the column redundant part shown in FIG. 7.

FIG. 14 is a circuit diagram showing a further embodiment of the column redundant part. The present embodiment shows a comparator part associated with the mat select signals corresponding to the encode fuse FUSE1 employed in the above-described embodiment. Complementary read signals formed in association with the presence or absence of opening of the four fuses F1 through F4 constituting the fuse FUSE1 are compared with their corresponding binary mat select signals BX8B, BX8T through BX11B and BX11T as they are. Namely, signals produced in the stage preceding a decoder circuit for producing sixteen mat select signals MS0B through MS15B, in other words, complementary address signals transmitted through row address buffers RADB8 through RADB11, are supplied as they are and compared with their corresponding bits. With respect to signals obtained by making comparisons between the address signals and the respective bits, NAND gate circuits perform comparisons between ones corresponding to the respective address signals. An output-stage NAND gate circuit compares coincidences of all the bits therewith.

In the present construction, a comparator is made up of NAND gate circuits, and low/high levels corresponding to the coincidence/non-coincidence are produced. It is therefore unnecessary to provide the above-described precharge circuits for precharging the output OUT for every memory access. Switch MOSFETs Q24 through Q26 similar to the above, which are controlled based on stored information in a fuse F5 for indicating the defects or failures of all the memory mats and a fuse F6 for indicating the storage of effective information in the fuses F1 through F5, are provided for the output OUT to thereby produce a relief mat coincidence signal MSEB. In the present construction, the number of the gate circuits can be reduced as compared with the number of the circuits shown in FIG. 13.

Figure 15:
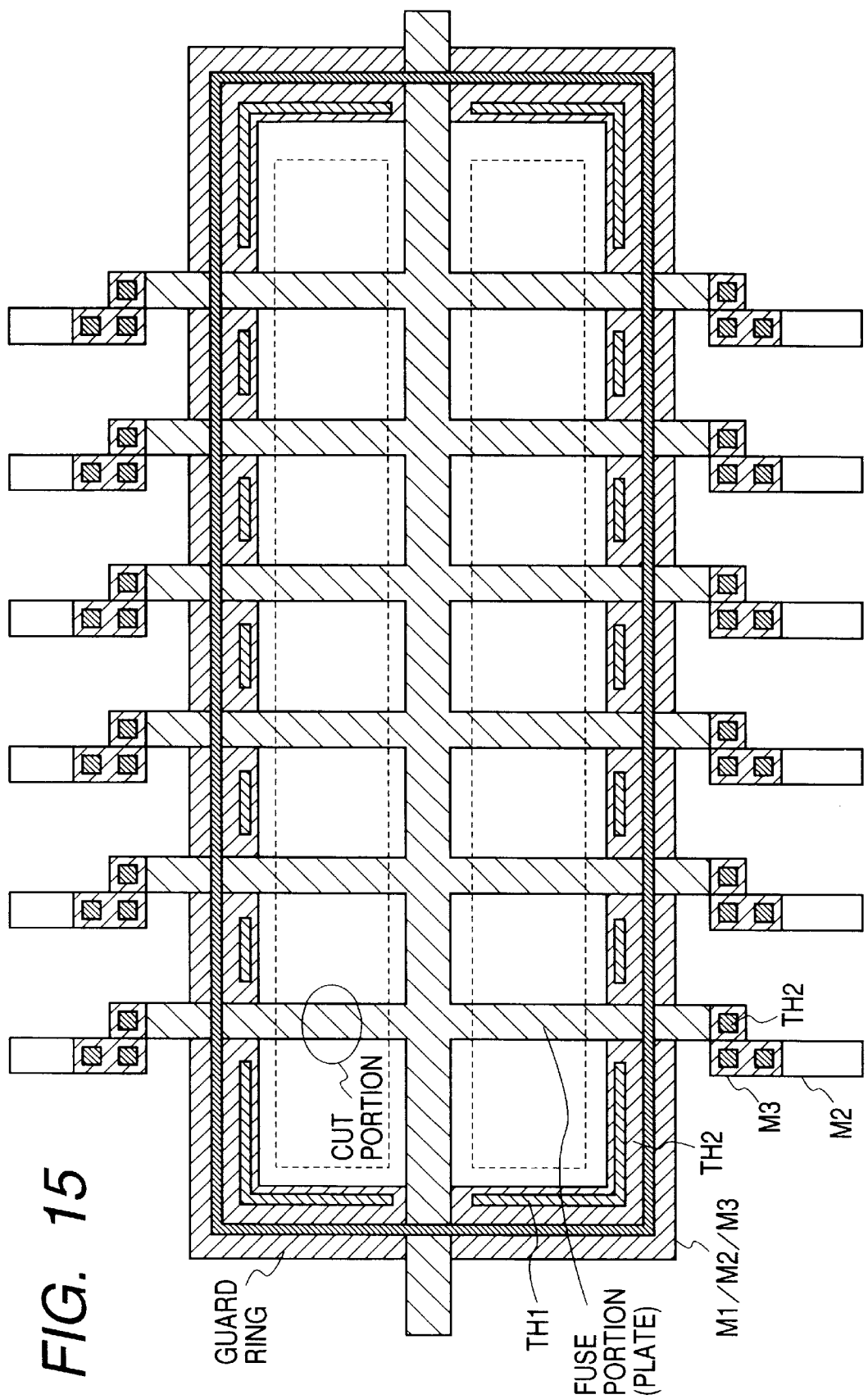
FIG. 15 is a layout diagram showing one embodiment of a fuse provided in the column redundant part employed in the semiconductor memory device according to the present invention.

FIG. 15 is a layout showing one embodiment of the fuse provided in the column redundant part. The fuse is formed of a material which constitutes a plate electrode of each memory cell. Therefore' the fuse is formed between a metal layer M1 of three metal layers, which corresponds to a first layer and a metal layer M2 corresponding to a second layer. One end side of the fuse is commonly used and is supplied with a power supply voltage through an unillustrated wire or interconnection, whereas the other end side thereof is electrically connected to each metal layer M3 through the metal layer M2 provided thereon and connected to the MOSFET circuits referred to above. A guard ring is provided on the surface of a semiconductor substrate with the fuse formed thereon so as to surround a portion in which the fuse is formed. Through holes TH1 identical to through holes TH1 defined to connect the metal layers M1 and M2 are defined along the guard ring in the form of grooves. However, the grooves for the through holes TH1 do not include the portion in which the fuse is formed. On the other hand, through holes TH2 identical to through holes TH2 for connecting the metal layers M2 and M3 are defined along the guard ring. Thus, they play a role in preventing water or the like from entering through an opening in which the fuse is formed therethrough.

Figure 16:
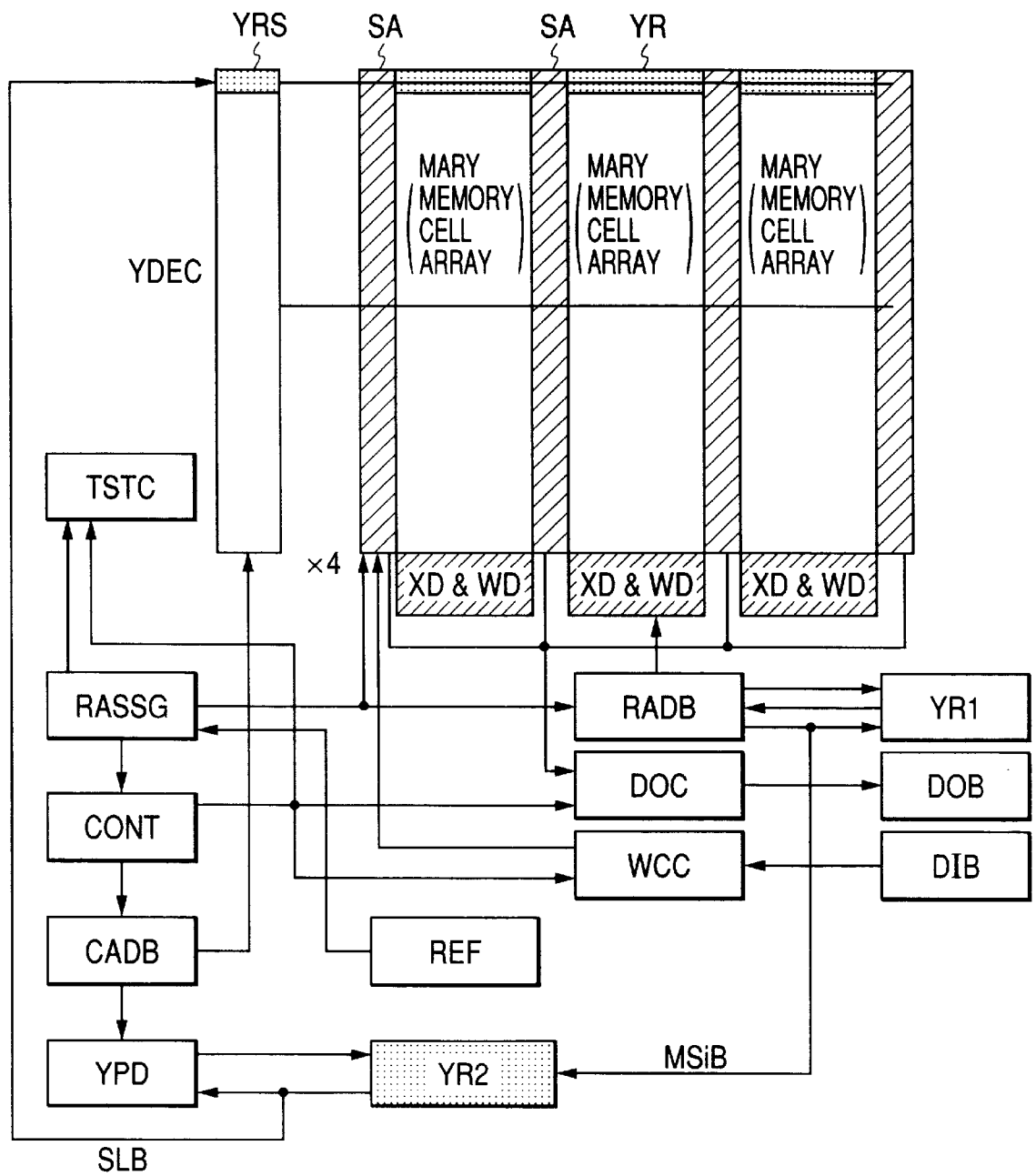
FIG. 16 is a schematic block diagram illustrating another embodiment of a semiconductor memory device according to the present invention.

FIG. 16 is a schematic block diagram showing another embodiment of a semiconductor memory device according to the present invention. Although the invention is not restricted in particular, the semiconductor memory device according to the present embodiment is intended for a dynamic RAM and is formed on a single semiconductor substrate such as monocrystalline silicon by a known semiconductor integrated circuit manufacturing technique.

The dynamic RAM according to the present embodiment is different from the above-described synchronous DRAM only in that input/output interfaces and memory cell arrays thereof are not divided into a plurality of banks. Namely, a RAS clock control circuit RSASG generates a row address capture timing signal, operation timing signals for row-system predecoders and decoders, a word-line select timing signal or a sense amplifier activation signal or the like in response to a row address strobe signal /RAS.

In response to a column address strobe signal /CAS, a write enable signal /WE, an output enable signal /OK or the like, a control circuit CONT makes a decision as to the operation mode and generates a column-system select timing signal corresponding to its decision. A refresh control circuit RFC supplies a refresh address to a row address buffer RASB through the RAS clock control circuit RASGC. Since the memory cell arrays are not distributed to the memory banks as described above, Y-system redundant circuits YR1 and YR2 are not provided as the same four types of ones in association with each memory bank as in the embodiment shown in FIG. 1. However, since the memory cell arrays are identical in configuration to those employed in the aforementioned embodiment, addresses corresponding to each bank are selected by being replaced by memory block addresses or the like. A system for selecting a memory cell array corresponding to the memory bank is simply different from that employed in the embodiment shown in FIG. 1. Redundant circuits themselves are implemented by configurations similar to those employed in the aforementioned embodiment.

Operations and effects obtained from the above-described embodiments are as follows:

(1) An advantageous effect can be obtained in that in a semiconductor memory device having at least one memory mat comprising a plurality of memory cells respectively provided at points where a plurality of word lines and spare word lines intersect a plurality of bit lines and spare bit lines placed so as to intersect the plurality of word lines and the spare word lines, respectively, a plurality of fuse means opened in accordance with stored information encoded with respect to addresses for specifying defective word lines or defective bit lines are used to control gate means in accordance with their corresponding complementary signals, whereby signals for selecting word lines or bit lines are transmitted from the gate means to produce coincidence and/or non-coincidence signals respectively, thereby making it possible to store and compare defective addresses by a less number of fuse means.

(2) Another advantageous effect can be brought about in that the encoded stored information is formed so as to have binary weights, and the gate means comprise transfer gate MOSFETs configured in tree form, which are switch-controlled by complementary signals corresponding to the binary weights and transmit signals for selecting a corresponding word line or bit lines through the tree-shaped transfer gate MOSFETs, whereby each of the comparison circuits or comparators can be configured by a less number of circuit devices or elements.

(3) A further advantageous effect can be obtained in that the encoded stored information is formed so as to have binary weights and the gate means are made up of combinations of logic gate circuits for receiving the complementary signals corresponding to the binary weights and signals for selecting the corresponding word line or bit lines having the binary weights according to the complementary signals, whereby each of the comparators can be formed by a smaller number of logic circuits.

(4) A still further advantageous effect can be obtained in that the encoded stored information is formed so as to have binary weights and the gate means are switch-controlled by logic circuits for decoding the complementary signals corresponding to the binary weights, and by signals outputted from the logic circuits to thereby transfer signals for selecting the corresponding word line or bit lines, whereby a relatively high-speed comparator can be configured which is capable of obtaining a comparison and decision result.

(5) A still further advantageous effect can be obtained in that each of the memory cells comprises a dynamic memory cell, an address multiplex system is used wherein each of the address signals for selecting the corresponding bit lines is inputted late with a time difference with respect to an address signal for selecting the word line, the memory mats are placed in plural form in the word line and bit line directions in the form of a matrix, the signals for selecting the bit lines are respectively generated from address selection circuits corresponding to column switch circuits for respectively selecting bit lines in a plurality of memory mats arranged in the bit line direction, and stored information encoded with respect to addresses for specifying the defective bit lines are respectively set as mat select signals for respectively selecting a plurality of memory mats arranged in the word line direction from the memory mats, so that the presence or absence of mats to be relieved can be determined according to the previously-input address signals, whereby a memory access can be speeded up while performing defect relief.

(6) A still further advantageous effect can be brought about in that gate means for making effective signals outputted therefrom by enable fuses indicative of the storage of defect information in the fuse means, and circuits for making ineffective the outputs of the gate means by fuses for bringing all the plurality of memory mats arranged in the bit line direction to failures and thereby forcefully generating coincidence signals are provided at output portions of the gate means, whereby the efficiency of defect relief can be improved.

(7) A still further advantageous effect can be brought about in that switch circuits are controlled by the coincidence signals corresponding to the respective memory mats so as to output defect address signals read from fuse means for storing binary-coded address signals indicative of defective bit lines in the corresponding memory mat, the outputs of the plurality of switch circuits provided in association with the plurality of memory mats are wired-OR connected to one another, defective address signals produced by the wired-OR connection are given in divided form and pre-decoded, and bit-line selection address signals inputted for a memory access are respectively compared with the corresponding pre-decoded signals, whereby bit lines to be relieved can be determined by a simple circuit configuration.

(8) A still further advantageous effect can be brought about in that the plurality of memory mats constitute one memory bank, such a memory bank is provided in plural form and a memory access is separately made to the memory banks, whereby an easy-to-use semiconductor memory device can be obtained.

The invention, which has been made by the present inventors, has been described above specifically by reference to various embodiments. However, the present invention is not necessarily limited to the disclosed embodiments. It is needless to say that various changes can be made to the embodiment within a scope not departing from the invention. In FIG. 2, for example, a two-bank configuration may be taken, as in the case in which the banks 0 and 1 are provided on both sides with the indirect circuit area interposed therebetween. The layout configuration on the semiconductor substrate is not necessarily limited to the configuration shown in FIG. 2 and can take various forms. The present invention is widely available for defect relief circuits for various semiconductor memory devices, such as an FRAM using ferroelectrics as information storage capacitors, a static RAM, etc. as well as a dynamic RAM and asynchronous DRAM.

Advantageous effects obtained by a typical one of the features disclosed in the present application will be briefly described as follows: In a semiconductor memory device having at least one memory mat comprising a plurality of memory cells respectively provided at points where a plurality of word lines and spare word lines intersect a plurality of bit lines and spare bit lines placed so as to intersect the plurality of word lines and the spare word lines, respectively, a plurality of fuse means opened in accordance with stored information encoded with respect to addresses for specifying defective word lines or defective bit lines are used to control gate means in accordance with their corresponding complementary signals so that signals for selecting word lines or bit lines are transmitted therefrom to produce coincidence and/or non-coincidence signals, whereby defective addresses can be stored and compared by a less number of fuse means.

What is claimed is:

1. A semiconductor memory device comprising:
    a memory mat including a plurality of memory cells respectively provided at points where a plurality of word lines and spare word lines intersect a plurality of bit lines and spare bit lines placed so as to intersect said plurality of word lines and spare word lines, respectively;
    a plurality of fuses allowed to open or remain unopen in accordance with stored information encoded with respect to addresses for specifying defective word lines or defective bit lines;

a plurality of gate circuits which receive a plurality of complementary signals respectively produced according to the presence or absence of opening of said plurality of fuses, and transmit a signal for selecting a word line or bit lines to thereby produce one of coincidence and non-coincidence signals; and a plurality of defect relief circuits each switching said defective word lines or said defective bit lines to said spare word lines or bit lines in response to a coincidence signal produced through said gate circuits, wherein said encoded stored information is formed so as to have binary weights and said gate circuits comprise transfer gate MOSFETs configured in tree form, which are switch-controlled by complementary signals corresponding to the binary weights, and transmit said select signal through said tree-shaped transfer gate MOSFETs.

2. A semiconductor memory device according to claim 1, further comprising:

a decoder which decodes each of address signals supplied from the outside and brings one of output signal lines therefor to a selected state, and wherein the output signal line of said decoder is connected to said one gate circuit and when information on the address signals supplied from the outside coincides with the encoded stored information, the coincidence signal is obtained from said gate circuits.

3. A semiconductor memory device comprising:

a plurality of memory mats each including a plurality of memory cells provided at points where a plurality of word lines and spare word lines intersect a plurality of bit lines and spare bit lines placed so as to intersect said plurality of word lines and spare word lines, respectively;

a plurality of fuses each allowed to open or remain unopen in accordance with stored information encoded with respect to first addresses for specifying a defect-existing memory mat of said plurality of memory mats;

gate circuits which receive signals respectively formed according to the presence or absence of opening of said plurality of fuses and signals formed based on second addresses supplied from the outside, said each gate circuit outputting a coincidence signal when said first and second addresses coincide with each other; and defect relief circuit which switches defective bit lines lying within each memory mat to spare bit lines based on said coincidence signal.

4. A semiconductor memory device according to claim 3, wherein each first address is a row address, each second address is a column address and said row and column addresses are supplied to said semiconductor memory device in time sequence.

5. A semiconductor memory device according to claim 4, wherein said encoded stored information is formed so as to have binary weights, and said gate circuits comprise transfer gate MOSFETs configured in tree form, which are switch-controlled by complementary signals corresponding to the binary weights, and which output said coincidence signal through said tree-shaped transfer gate MOSFETs.

6. A semiconductor memory device according to claim 4 or 5, wherein each memory cell comprises a dynamic memory cell, said memory mats are respectively placed in plural form in the word line and bit line directions, signals for selecting the bit lines are produced by column decoders corresponding to the plurality of memory mats arranged in the bit line direction, and said first addresses respectively select the plurality of memory mats arranged in the word line direction, of said memory mats.

7. A semiconductor memory device according to claim 6, further comprising fuses for writing therein enable information indicative of the storage of defective information in said plurality of fuses and wherein output parts of said gate circuits are controlled based on the information stored in the fuses with the enable information written therein.

8. A semiconductor memory device according to claim 7, further comprising fuses for recognizing a plurality of memory mats arranged in the bit line direction as defective and wherein the outputs of said gate circuits are rendered ineffective based on the information stored in the fuses to thereby forcibly produce a coincidence signal.

9. A semiconductor memory device comprising:

a plurality of memory mats, each memory mat including a plurality of memory cells provided at points where a plurality of word lines and spare word lines intersect a plurality of bit lines and spare bit lines placed so as to intersect said plurality of word lines and spare word lines, respectively;

a plurality of first fuses each allowed to open or remain unopen in accordance with first stored information encoded with respect to a first address for specifying a defect-existing memory mat of said plurality of memory mats;

a first gate circuit which receives signals respectively formed according to the presence or absence of opening of said plurality of first fuses and signals formed based on a second address supplied from the outside, said first gate circuit outputting a first coincidence signal when said first and second addresses coincide with each other;

a plurality of second fuses allowed to open or remain unopen in accordance with second stored information encoded with respect to a third address for specifying defective bit lines lying within a predetermined memory mat;

a second gate circuit which receives signals formed according to the presence or absence of opening of said second fuses and signals formed based on a fourth address supplied from the outside, said second gate circuit outputting a second coincidence signal when said third and fourth addresses coincide with each other and said first coincidence signal is outputted; and a defect relief circuit which switches defective bit lines lying within said predetermined memory mat to spare bit lines based on said second coincidence signal.

10. A semiconductor memory device according to claim 9, wherein said encoded first stored information is formed so as to have a binary weight, and said first gate circuit comprises transfer gate MOSFETs configured in tree form, which are switch-controlled by complementary signals corresponding to the binary weight, and which output said first coincidence signal through said tree-shaped transfer gate MOSFETs.

11. A semiconductor memory device according to claim 10, wherein said second address is a row address, said fourth address is a column address and said row and column addresses are supplied to said semiconductor memory device in time sequence.

12. A semiconductor device comprising:

a memory mat including a plurality of memory cells respectively provided at points where a plurality of word lines and spare word lines intersect a plurality of bit lines and spare bit lines placed so as to intersect said plurality of word lines and spare word lines, respectively;

a plurality of fuses allowed to open in accordance with stored information encoded with respect to addresses for specifying defective word lines or defective bit lines;

a plurality of gates which receive a plurality of complementary signals respectively produced according to the presence or absence of opening of said plurality of fuses, and transmitting signals for selecting their corresponding word lines or bit lines to thereby produce coincidence and/or non-coincidence signals; and a plurality of defect relief circuits each switching said defective word lines or said defective bit lines to said spare word lines or bit lines in response to a coincidence signal produced through said gates, wherein said encoded stored information is formed so as to have binary weights and said gates comprise transfer gate MOSFETs configured in tree form, which are switch-controlled by complementary signals corresponding to the binary weights, and which transmit said select signals for selecting word lines or bit lines through said tree-shaped transfer gate MOSFETs.

13. A semiconductor memory device comprising:

a memory mat including a plurality of memory cells respectively provided at points where a plurality of word lines and spare word lines intersect a plurality of bit lines and spare bit lines placed so as to intersect said plurality of word lines and spare word lines, respectively;

a plurality of fuses allowed to open in accordance with stored information encoded with respect to addresses for specifying defective word lines or defective bit lines;

a plurality of gates which receive a plurality of complementary signals respectively produced according to the presence or absence of opening of said plurality of fuses, and transmitting signals for selecting their corresponding word lines or bit lines to thereby produce coincidence and/or non-coincidence signals; and a plurality of defect relief circuits each switching said defective word lines or said defective bit lines to said spare word lines or bit lines in response to a coincidence signal produced through said gates, wherein said encoded stored information is formed so as to have binary weights and said gates are respectively comprised of combinations of logic gate circuits for receiving complementary signals corresponding to the binary weights and signals for selecting the word lines or bit lines, said signal having binary weights in association with the complementary signals.

14. A semiconductor memory device comprising:

a memory mat including a plurality of memory cells respectively provided at points where a plurality of word lines and spare word lines intersect a plurality of bit lines and spare bit lines placed so as to intersect said plurality of word lines and spare word lines, respectively;

a plurality of fuses allowed to open in accordance with stored information encoded with respect to addresses for specifying defective word lines or defective bit lines;

a plurality of gates which receive a plurality of complementary signals respectively produced according to the presence or absence of opening of said plurality of fuses, and transmitting signals for selecting their corresponding word lines or bit lines to thereby produce coincidence and/or non-coincidence signals; and a plurality of defect relief circuits each switching said defective word lines or said defective bit lines to said spare word lines or bit lines in response to a coincidence signal produced through said gates, wherein said encoded stored information is formed so as to have binary weights, and said gates are switch-controlled by logic circuits for decoding complementary signals corresponding to the binary weights, and signals outputted from the logic circuits to thereby transfer signals for selecting the corresponding word line or bit lines.

15. A semiconductor memory device according to claim 12, 13, or 14, wherein said each memory cell comprises a dynamic memory cell, an address signal for selecting corresponding bit lines is inputted late with a time difference with respect to an address signal for selecting a word line, said memory mats are respectively placed in plural form in the word line and bit line directions, the signals for selecting the bit lines are respectively generated from address selection circuits corresponding to column switch circuits for respectively selecting bit lines of a plurality of memory mats arranged in the bit line direction, and stored information encoded with respect to addresses for specifying defective bit lines are respectively set as mat select signals for respectively selecting a plurality of memory mats arranged in the word line direction from the memory mats.

16. A semiconductor memory device according to claim 15, wherein each of said gates has an output portion which includes, a first circuit which makes effective signals outputted therefrom, based on information stored in the fuses writing therein enable information indicative of the storage of defective information in said plurality of fuses; and a second circuit which makes ineffective the outputs of said gates, based on information stored in the fuses for causing all the plurality of memory mats arranged in the bit line direction to be defective and thereby forcefully generating coincidence signals.

17. A semiconductor memory device according to claim 16, wherein the coincidence signals corresponding to the respective memory mats control their corresponding switch circuits, said switch circuits output defective address signals read from the fuses for storing binary-coded address signals indicative of defective bit lines in the corresponding memory mat, the outputs of the plurality of switch circuits provided in association with the plurality of memory mats are wired-OR connected to one another, defective address signals produced by a wired-OR connection are given in divided form and pre-decoded and respectively compared with corresponding pre-decoded signals of bit-line selection address signals inputted for a memory access, whereby a signal indicative of whether a memory access to defective bit lines is being performed, is produced.

18. A semiconductor memory device according to claim 15, wherein said plurality of memory mats constitute one memory bank, said memory bank is provided in plural form and a memory access is separately made to the memory banks.

* * * * *